United States Patent
Stetson, Jr. et al.

(10) Patent No.: US 10,120,039 B2
(45) Date of Patent: Nov. 6, 2018

(54) APPARATUS AND METHOD FOR CLOSED LOOP PROCESSING FOR A MAGNETIC DETECTION SYSTEM

(71) Applicant: Lockheed Martin Corporation, Bethesda, MD (US)

(72) Inventors: John B. Stetson, Jr., New Hope, PA (US); Jeff D. Cammerata, Medford Lakes, NJ (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 418 days.

(21) Appl. No.: 15/003,519

(22) Filed: Jan. 21, 2016

(65) Prior Publication Data

US 2017/0146616 A1   May 25, 2017

Related U.S. Application Data

(60) Provisional application No. 62/258,003, filed on Nov. 20, 2015.

(51) Int. Cl.
*G01V 3/00* (2006.01)
*G01R 33/032* (2006.01)
*G01R 33/00* (2006.01)

(52) U.S. Cl.
CPC ....... *G01R 33/032* (2013.01); *G01R 33/0017* (2013.01)

(58) Field of Classification Search
CPC .............. G01R 33/032; G01R 33/0017; G01R 33/0052; G01R 35/005

(Continued)

(56) References Cited

U.S. PATENT DOCUMENTS

| 2,746,027 A | 5/1956 | Murray |
| 3,359,812 A | 12/1967 | Everitt |

(Continued)

FOREIGN PATENT DOCUMENTS

| CN | 105738845 A | 7/2016 |
| DE | 69608006 T2 | 2/2001 |

(Continued)

OTHER PUBLICATIONS

GB Office Action dated Jan. 10, 2017, in related national stage application GB1618202.4.

(Continued)

*Primary Examiner* — Patrick Assouad
*Assistant Examiner* — Demetrius Pretlow
(74) *Attorney, Agent, or Firm* — Foley & Lardner LLP

(57) ABSTRACT

A system for magnetic detection includes a nitrogen vacancy (NV) diamond material comprising a plurality of NV centers, a magnetic field generator that generates a magnetic field that is applied to the NV diamond material, a radio frequency (RF) excitation source that provides RF excitation to the NV diamond material, an optical excitation source that provides optical excitation to the NV diamond material, an optical detector that receives an optical signal emitted by the NV diamond material, and a controller. The controller is configured to compute a total incident magnetic field at the NV diamond material based on the optical signal emitted by the NV diamond material, and drive the magnetic field generator to generate a compensatory magnetic field, the generated compensatory magnetic field being set to offset a shift in the optical signal emitted by the NV diamond material caused by an external magnetic field.

38 Claims, 9 Drawing Sheets

(58) Field of Classification Search
USPC .................................................. 324/304
See application file for complete search history.

(56) References Cited

U.S. PATENT DOCUMENTS

| | | | |
|---|---|---|---|
| 3,389,333 A | 6/1968 | Wolff et al. |
| 3,490,032 A | 1/1970 | Zurflueh |
| 3,514,723 A | 5/1970 | Cutler |
| 3,518,531 A | 6/1970 | Huggett |
| 3,621,380 A | 11/1971 | Barlow, Jr. |
| 3,745,452 A | 7/1973 | Osburn et al. |
| 3,899,758 A | 8/1975 | Maier et al. |
| 4,025,873 A | 5/1977 | Chilluffo |
| 4,047,805 A | 9/1977 | Sekimura |
| 4,078,247 A | 3/1978 | Albrecht |
| 4,084,215 A | 4/1978 | Willenbrock |
| 4,322,769 A | 3/1982 | Cooper |
| 4,329,173 A | 5/1982 | Culling |
| 4,359,673 A | 11/1982 | Bross et al. |
| 4,368,430 A | 1/1983 | Dale et al. |
| 4,410,926 A | 10/1983 | Hafner et al. |
| 4,437,533 A | 3/1984 | Bierkarre et al. |
| 4,514,083 A | 4/1985 | Fukuoka |
| 4,588,993 A | 5/1986 | Babij et al. |
| 4,636,612 A | 1/1987 | Cullen |
| 4,638,324 A | 1/1987 | Hannan |
| 4,675,522 A | 6/1987 | Arunkumar |
| 4,768,962 A | 9/1988 | Kupfer et al. |
| 4,818,990 A | 4/1989 | Fernandes |
| 4,820,986 A | 4/1989 | Mansfield et al. |
| 4,945,305 A | 7/1990 | Blood |
| 4,958,328 A | 9/1990 | Stubblefield |
| 4,982,158 A | 1/1991 | Nakata et al. |
| 5,019,721 A | 5/1991 | Martens et al. |
| 5,038,103 A | 8/1991 | Scarzello et al. |
| 5,113,136 A | 5/1992 | Hayashi et al. |
| 5,134,369 A | 7/1992 | Lo et al. |
| 5,189,368 A | 2/1993 | Chase |
| 5,200,855 A | 4/1993 | Meredith et al. |
| 5,245,347 A | 9/1993 | Bonta et al. |
| 5,252,912 A | 10/1993 | Merritt et al. |
| 5,301,096 A | 4/1994 | Klontz et al. |
| 5,384,109 A | 1/1995 | Klaveness et al. |
| 5,396,802 A | 3/1995 | Moss |
| 5,420,549 A | 5/1995 | Prestage |
| 5,425,179 A | 6/1995 | Nickel et al. |
| 5,427,915 A | 6/1995 | Ribi et al. |
| 5,548,279 A | 8/1996 | Gaines |
| 5,568,516 A | 10/1996 | Strohallen et al. |
| 5,586,069 A | 12/1996 | Dockser |
| 5,597,762 A | 1/1997 | Popovici et al. |
| 5,638,472 A | 6/1997 | Van Delden |
| 5,694,375 A | 12/1997 | Woodall |
| 5,719,497 A | 2/1998 | Veeser et al. |
| 5,731,996 A | 3/1998 | Gilbert |
| 5,764,061 A | 6/1998 | Asakawa et al. |
| 5,818,352 A | 10/1998 | McClure |
| 5,846,708 A | 12/1998 | Hollis et al. |
| 5,888,925 A | 3/1999 | Smith et al. |
| 5,907,420 A | 5/1999 | Chraplyvy et al. |
| 5,907,907 A | 6/1999 | Ohtomo et al. |
| 5,915,061 A | 6/1999 | Vanoli |
| 6,042,249 A | 3/2000 | Spangenberg |
| 6,057,684 A | 5/2000 | Murakami et al. |
| 6,124,862 A | 9/2000 | Boyken et al. |
| 6,130,753 A | 10/2000 | Hopkins et al. |
| 6,144,204 A | 11/2000 | Sementchenko |
| 6,195,231 B1 | 2/2001 | Sedlmayr et al. |
| 6,215,303 B1 | 4/2001 | Weinstock et al. |
| 6,360,173 B1 | 3/2002 | Fullerton |
| 6,398,155 B1 | 6/2002 | Hepner et al. |
| 6,433,944 B1 | 8/2002 | Nagao et al. |
| 6,472,651 B1 | 10/2002 | Ukai |
| 6,472,869 B1 | 10/2002 | Upschulte et al. |
| 6,504,365 B2 | 1/2003 | Kitamura |
| 6,542,242 B1 | 4/2003 | Yost et al. |
| 6,621,578 B1 | 9/2003 | Mizoguchi |
| 6,636,146 B1 | 10/2003 | Wehoski |
| 6,686,696 B2 | 2/2004 | Mearini et al. |
| 6,690,162 B1 | 2/2004 | Schopohl et al. |
| 6,765,487 B1 | 7/2004 | Holmes et al. |
| 6,788,722 B1 | 9/2004 | Kennedy et al. |
| 6,809,829 B1 | 10/2004 | Takata et al. |
| 7,118,657 B2 | 10/2006 | Golovchenko et al. |
| 7,221,164 B1 | 5/2007 | Barringer |
| 7,277,161 B2 | 10/2007 | Claus |
| 7,305,869 B1 | 12/2007 | Berman et al. |
| 7,307,416 B2 | 12/2007 | Islam et al. |
| RE40,343 E | 5/2008 | Anderson |
| 7,400,142 B2 | 7/2008 | Greelish |
| 7,413,011 B1 | 8/2008 | Chee et al. |
| 7,427,525 B2 | 9/2008 | Santori et al. |
| 7,448,548 B1 | 11/2008 | Compton |
| 7,471,805 B2 | 12/2008 | Goldberg |
| 7,474,090 B2 | 1/2009 | Islam et al. |
| 7,543,780 B1 | 6/2009 | Marshall et al. |
| 7,546,000 B2 | 6/2009 | Spillane et al. |
| 7,570,050 B2 | 8/2009 | Sugiura |
| 7,608,820 B1 | 10/2009 | Berman et al. |
| 7,705,599 B2 | 4/2010 | Strack et al. |
| 7,805,030 B2 | 9/2010 | Bratkovski et al. |
| 7,868,702 B2 | 1/2011 | Ohnishi |
| 7,889,484 B2 | 2/2011 | Choi |
| 7,916,489 B2 | 3/2011 | Okuya |
| 7,983,812 B2 | 7/2011 | Potter |
| 8,022,693 B2 | 9/2011 | Meyersweissflog |
| 8,120,351 B2 | 2/2012 | Rettig et al. |
| 8,120,355 B1 | 2/2012 | Stetson |
| 8,124,296 B1 | 2/2012 | Fischel |
| 8,138,756 B2 | 3/2012 | Barclay et al. |
| 8,193,808 B2 | 6/2012 | Fu et al. |
| 8,294,306 B2 | 10/2012 | Kumar et al. |
| 8,310,251 B2 | 11/2012 | Orazem |
| 8,311,767 B1 | 11/2012 | Stetson |
| 8,334,690 B2 | 12/2012 | Kitching et al. |
| 8,415,640 B2 | 4/2013 | Babinec et al. |
| 8,471,137 B2 | 6/2013 | Adair et al. |
| 8,480,653 B2 | 7/2013 | Birchard et al. |
| 8,525,516 B2 | 9/2013 | Le Prado et al. |
| 8,547,090 B2 | 10/2013 | Lukin et al. |
| 8,574,536 B2 | 11/2013 | Boudou et al. |
| 8,575,929 B1 | 11/2013 | Wiegert |
| 8,686,377 B2 | 4/2014 | Twitchen et al. |
| 8,704,546 B2 | 4/2014 | Konstantinov |
| 8,758,509 B2 | 6/2014 | Twitchen et al. |
| 8,803,513 B2 | 8/2014 | Hosek et al. |
| 8,854,839 B2 | 10/2014 | Cheng et al. |
| 8,885,301 B1 | 11/2014 | Heidmann |
| 8,913,900 B2 | 12/2014 | Lukin et al. |
| 8,933,594 B2 | 1/2015 | Kurs |
| 8,947,080 B2 | 2/2015 | Lukin et al. |
| 8,963,488 B2 | 2/2015 | Campanella et al. |
| 9,103,873 B1 | 8/2015 | Martens et al. |
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,291,508 B1 | 3/2016 | Biedermann et al. |
| 9,369,182 B2 | 6/2016 | Kurs et al. |
| 9,442,205 B2 | 9/2016 | Geiser et al. |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,645,223 B2 | 5/2017 | Megdal et al. |
| 9,680,338 B2 | 6/2017 | Malpas et al. |
| 9,689,679 B2 | 6/2017 | Budker et al. |
| 9,720,055 B1 | 8/2017 | Hahn et al. |
| 9,778,329 B2 | 10/2017 | Heidmann |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |

(56) References Cited

U.S. PATENT DOCUMENTS

| | | |
|---|---|---|
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0245078 A1 | 11/2006 | Kawamura |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0266050 A1 | 10/2008 | Crouse et al. |
| 2008/0299904 A1 | 12/2008 | Yi et al. |
| 2009/0015262 A1 | 1/2009 | Strack et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1 | 3/2009 | Mort et al. |
| 2009/0079426 A1 | 3/2009 | Anderson |
| 2009/0132100 A1 | 5/2009 | Shibata |
| 2009/0157331 A1 | 6/2009 | Van Netten |
| 2009/0161264 A1 | 6/2009 | Meyersweissflog |
| 2009/0195244 A1 | 8/2009 | Mouget et al. |
| 2009/0222208 A1 | 9/2009 | Speck |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1 | 1/2010 | Liu et al. |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0277121 A1 | 11/2010 | Hall et al. |
| 2010/0308813 A1 | 12/2010 | Lukin et al. |
| 2010/0315079 A1 | 12/2010 | Lukin et al. |
| 2010/0321117 A1* | 12/2010 | Gan ............... G04F 5/145 331/3 |
| 2010/0326042 A1 | 12/2010 | McLean et al. |
| 2011/0034393 A1 | 2/2011 | Justen et al. |
| 2011/0059704 A1 | 3/2011 | Norimatsu et al. |
| 2011/0062957 A1* | 3/2011 | Fu ............... G01N 24/088 324/307 |
| 2011/0063957 A1 | 3/2011 | Isshiki et al. |
| 2011/0066379 A1 | 3/2011 | Mes |
| 2011/0120890 A1 | 5/2011 | MacPherson et al. |
| 2011/0127999 A1 | 6/2011 | Lott et al. |
| 2011/0165862 A1 | 7/2011 | Yu et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2011/0315988 A1 | 12/2011 | Yu et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1 | 4/2012 | Breed |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232838 A1 | 9/2012 | Kemppi et al. |
| 2012/0235633 A1 | 9/2012 | Kesler et al. |
| 2012/0235634 A1 | 9/2012 | Hall et al. |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0093424 A1 | 4/2013 | Blank et al. |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265042 A1 | 10/2013 | Kawabata et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2014/0012505 A1 | 1/2014 | Smith et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1 | 3/2014 | Keeling et al. |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0154792 A1 | 6/2014 | Moynihan et al. |
| 2014/0159652 A1 | 6/2014 | Hall et al. |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0210473 A1 | 7/2014 | Campbell et al. |
| 2014/0215985 A1 | 8/2014 | Pollklas |
| 2014/0225606 A1 | 8/2014 | Endo et al. |
| 2014/0247094 A1 | 9/2014 | Englund et al. |
| 2014/0265555 A1 | 9/2014 | Hall et al. |
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1 | 10/2014 | Malay |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0015247 A1 | 1/2015 | Goodwill et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1 | 3/2015 | Widmer et al. |

(56) References Cited

U.S. PATENT DOCUMENTS

| | | | |
|---|---|---|---|
| 2015/0090033 A1* | 4/2015 | Budker | G01C 19/58 73/504.05 |
| 2015/0128431 A1 | 5/2015 | Kuo | |
| 2015/0137793 A1 | 5/2015 | Englund et al. | |
| 2015/0153151 A1 | 6/2015 | Kochanski | |
| 2015/0192532 A1* | 7/2015 | Clevenson | G01N 24/006 324/304 |
| 2015/0192596 A1 | 7/2015 | Englund et al. | |
| 2015/0225052 A1 | 8/2015 | Cordell | |
| 2015/0235661 A1 | 8/2015 | Heidmann | |
| 2015/0253355 A1 | 9/2015 | Grinolds et al. | |
| 2015/0268373 A1 | 9/2015 | Meyer | |
| 2015/0269957 A1 | 9/2015 | El Hallak et al. | |
| 2015/0276897 A1 | 10/2015 | Leussler et al. | |
| 2015/0288352 A1 | 10/2015 | Krause et al. | |
| 2015/0299894 A1 | 10/2015 | Markham et al. | |
| 2015/0303333 A1 | 10/2015 | Yu et al. | |
| 2015/0314870 A1 | 11/2015 | Davies | |
| 2015/0326030 A1 | 11/2015 | Malpas et al. | |
| 2015/0326410 A1 | 11/2015 | Krause et al. | |
| 2015/0354985 A1 | 12/2015 | Judkins et al. | |
| 2015/0374250 A1* | 12/2015 | Hatano | A61B 5/04008 600/409 |
| 2015/0377865 A1 | 12/2015 | Acosta et al. | |
| 2015/0377987 A1 | 12/2015 | Menon et al. | |
| 2016/0018269 A1* | 1/2016 | Maurer | G01K 11/20 374/121 |
| 2016/0031339 A1 | 2/2016 | Geo | |
| 2016/0036529 A1 | 2/2016 | Griffith et al. | |
| 2016/0052789 A1 | 2/2016 | Gaathon et al. | |
| 2016/0054402 A1* | 2/2016 | Meriles | G01R 33/282 324/309 |
| 2016/0071532 A9 | 3/2016 | Heidmann | |
| 2016/0077167 A1 | 3/2016 | Heidmann | |
| 2016/0097702 A1 | 4/2016 | Zhao et al. | |
| 2016/0113507 A1 | 4/2016 | Reza et al. | |
| 2016/0131723 A1 | 5/2016 | Nagasaka | |
| 2016/0139048 A1 | 5/2016 | Heidmann | |
| 2016/0146904 A1 | 5/2016 | Stetson et al. | |
| 2016/0161429 A1 | 6/2016 | Englund et al. | |
| 2016/0214714 A1 | 7/2016 | Sekelsky | |
| 2016/0216304 A1 | 7/2016 | Sekelsky | |
| 2016/0216340 A1 | 7/2016 | Egan et al. | |
| 2016/0216341 A1 | 7/2016 | Boesch et al. | |
| 2016/0221441 A1 | 8/2016 | Hall et al. | |
| 2016/0223621 A1 | 8/2016 | Kaup et al. | |
| 2016/0231394 A1 | 8/2016 | Manickam et al. | |
| 2016/0266220 A1 | 9/2016 | Sushkov et al. | |
| 2016/0282427 A1 | 9/2016 | Heidmann | |
| 2016/0291191 A1 | 10/2016 | Fukushima et al. | |
| 2016/0313408 A1* | 10/2016 | Hatano | G01R 33/032 |
| 2016/0348277 A1 | 12/2016 | Markham et al. | |
| 2016/0356863 A1 | 12/2016 | Boesch et al. | |
| 2017/0010214 A1 | 1/2017 | Osawa et al. | |
| 2017/0010334 A1 | 1/2017 | Krause et al. | |
| 2017/0010338 A1 | 1/2017 | Bayat et al. | |
| 2017/0010594 A1 | 1/2017 | Kottapalli et al. | |
| 2017/0023487 A1 | 1/2017 | Boesch | |
| 2017/0030982 A1* | 2/2017 | Jeske | G01R 33/032 |
| 2017/0038314 A1 | 2/2017 | Suyama et al. | |
| 2017/0068012 A1 | 3/2017 | Fisk | |
| 2017/0074660 A1 | 3/2017 | Gann et al. | |
| 2017/0075020 A1 | 3/2017 | Gann et al. | |
| 2017/0104426 A1 | 4/2017 | Mills | |
| 2017/0138735 A1 | 5/2017 | Cappellaro et al. | |
| 2017/0199156 A1 | 7/2017 | Villani et al. | |
| 2017/0205526 A1 | 7/2017 | Meyer | |
| 2017/0207823 A1 | 7/2017 | Russo et al. | |
| 2017/0211947 A1 | 7/2017 | Fisk | |
| 2017/0212046 A1 | 7/2017 | Cammerata | |
| 2017/0212177 A1 | 7/2017 | Coar et al. | |
| 2017/0212178 A1 | 7/2017 | Hahn et al. | |
| 2017/0212179 A1 | 7/2017 | Hahn et al. | |
| 2017/0212180 A1 | 7/2017 | Hahn et al. | |
| 2017/0212181 A1 | 7/2017 | Coar et al. | |
| 2017/0212182 A1 | 7/2017 | Hahn et al. | |
| 2017/0212183 A1 | 7/2017 | Egan et al. | |
| 2017/0212184 A1 | 7/2017 | Coar et al. | |
| 2017/0212185 A1 | 7/2017 | Hahn et al. | |
| 2017/0212186 A1 | 7/2017 | Hahn et al. | |
| 2017/0212187 A1 | 7/2017 | Hahn et al. | |
| 2017/0212190 A1 | 7/2017 | Reynolds et al. | |
| 2017/0212258 A1 | 7/2017 | Fisk | |

FOREIGN PATENT DOCUMENTS

| | | |
|---|---|---|
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2423366 A | 8/2008 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |

(56) References Cited

FOREIGN PATENT DOCUMENTS

| | | |
|---|---|---|
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 A1 | 10/2015 |
| WO | WO-2015/157290 A1 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 A1 | 7/2016 |
| WO | WO-2016/118791 A1 | 7/2016 |
| WO | WO-2016/122965 A1 | 8/2016 |
| WO | WO-2016/122966 A1 | 8/2016 |
| WO | WO-2016/126435 A1 | 8/2016 |
| WO | WO-2016/126436 A1 | 8/2016 |
| WO | WO-2016/190909 A2 | 12/2016 |
| WO | WO-2017/007513 A1 | 1/2017 |
| WO | WO-2017/007514 A1 | 1/2017 |
| WO | WO-2017/014807 A1 | 1/2017 |
| WO | WO-2017/039747 A1 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

Bucher et al, "High Resolution Magnetic Resonance Spectroscopy Using Solid-State Spins", May 25, 2017, downloaded from https://arxiv.org/ (arXiv.org > quant-ph > arXiv:1705.08887) on May 25, 2017, pp. 1-24.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.
International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Michaelovich et al., "Polarization Dependencies of the Nitrogen-Vacancy Center." Undergraduate Project Report, Ben-Gurion University, Aug. 2015, pp. 1-9.
Notice of Allowance dated Jun. 8, 2017, from related U.S. Appl. No. 15/351,862, 7 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jul. 24, 2017 from related U.S. Appl. No. 15/003,088, 12 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from U.S. Appl. No. 15/003,678, 15 pages.
U.S. Office Action dated Jun. 2, 2017, from related U.S. Appl. No. 15/476,636, 10 pages.
Wroble, "Performance Analysis of Magnetic Indoor Local Positioning System." Western Michigan University Master's Theses, Paper 609 (Jun. 2015), 42 pages.
International Search Report and Written Opinion from related PCT application PCT/US2017/035315 dated Aug. 24, 2017, 7 pages.
Ramsey, et al., "Phase Shifts in the Molecular Beam Method of Separated Oscillating Fields", Physical Review, vol. 84, No. 3, Nov. 1, 1951, pp. 506-507.
U.S. Notice of Allowance on U.S. Appl. No. 14/676,740 dated Sep. 1, 2017, 7 pages.
U.S. Notice of Allowance on U.S. Appl. No. 15/003,206 dated Sep. 18, 2017, 11 pages.
U.S. Notice of Allowance on U.S. Appl. No. 15/003,281 dated Sep. 26, 2017, 7 pages.
U.S. Notice of Allowance on U.S. Appl. No. 15/476,636 dated Sep. 14, 2017, 10 pages.
U.S. Office Action on U.S. Appl. No. 15/003,176 dated Sep. 27, 2017, 8 pages.

(56) References Cited

OTHER PUBLICATIONS

U.S. Office Action on U.S. Appl. No. 15/003,292 dated Sep. 8, 2017, 8 pages.
Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016), 17 pages.
International Preliminary Report on Patentability dated Oct. 20, 2016 from related PCT application PCT/US2015/024723, 7 pages.
International Search Report and Written Opinion of the International Searching Authority dated Sep. 13, 2016 from related PCT application PCT/US16/14377, 11 pages.
Notice of Allowance dated Aug. 17, 2016, from related U.S. Appl. No. 15/003,718, 8 pages.
Notice of Allowance dated Sep. 8, 2016, from related U.S. Appl. No. 15/003,298, 10 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
U.S. Office Action dated Aug. 24, 2016 from related U.S. Appl. No. 14/676,740, 19 pages.
U.S. Office Action dated Oct. 14, 2016 from related U.S. Appl. No. 15/003,677, 13 pages.
U.S. Office Action dated Oct. 19, 2016 from related U.S. Appl. No. 15/218,821, 6 pages.
U.S. Office Action dated Nov. 2, 2016 from related U.S. Appl. No. 15/003,256, 19 pages.
U.S. Office Action dated Nov. 3, 2016 from related U.S. Appl. No. 15/204,675, 9 pages.
Widmann et al., "Coherent control of single spins in silicon carbide at room temperature," Nature Materials, 14: 164-168 (Feb. 2015) (available online Dec. 1, 2014), 5 pages.
U.S. Appl. No. 14/659,498, filed Mar. 16, 2015.
U.S. Appl. No. 14/676,740, filed Apr. 1, 2015.
U.S. Appl. No. 15/003,678, filed Jan. 21, 2016.
U.S. Appl. No. 14/680,877, filed Apr. 7, 2015.
U.S. Appl. No. 14/866,730, filed Sep. 25, 2015.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016.
U.S. Appl. No. 15/003,309, filed Jan. 21, 2016.
U.S. Appl. No. 15/003,176, filed Jan. 21, 2016.
U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016.
U.S. Appl. No. 15/003,677, filed Jan. 21, 2016.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016.
U.S. Appl. No. 15/003,718, filed Jan. 21, 2016.
U.S. Appl. No. 15/003,062, filed Jan. 21, 2016.
U.S. Appl. No. 15/003,652, filed Jan. 21, 2016.
U.S. Appl. No. 15/003,634, filed Jan. 21, 2016.
U.S. Appl. No. 15/003,670, filed Jan. 21, 2016.
U.S. Appl. No. 15/003,088, filed Jan. 21, 2016.
U.S. Appl. No. 15/003,797, filed Jan. 21, 2016.
U.S. Appl. No. 15/003,590, filed Jan. 21, 2016.
U.S. Appl. No. 15/003,206, filed Jan. 21, 2016.
U.S. Appl. No. 15/003,193, filed Jan. 21, 2016.
U.S. Appl. No. 15/003,617, filed Jan. 21, 2016.
U.S. Appl. No. 15/003,396, filed Jan. 21, 2016.
U.S. Appl. No. 15/003,177, filed Jan. 21, 2016.
U.S. Appl. No. 15/003,209, filed Jan. 21, 2016.
U.S. Appl. No. 15/179,957, filed Jun. 10, 2016.
U.S. Appl. No. 15/207,457, filed Jul. 11, 2016.
U.S. Appl. No. 15/218,821, filed Jul. 25, 2016.
U.S. Appl. No. 15/204,674, filed Jul. 7, 2016.
Brenneis, et al. "Ultrafast electronic readout of diamond nitrogen-vacancy centres coupled to graphene." Nature nanotechnology 10.2 (2015): 135-139.
Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability." arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.
Heerema, et al. "Graphene nanodevices for DNA sequencing." Nature nanotechnology 11.2 (Feb. 3, 2016): 127-136.
International Search Report and Written Opinion of the International Searching Authority dated Apr. 4, 2017 from related PCT application PCT/US16/68366, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 6 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017 from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Moessle, et al. "SQUID-detected magnetic resonance imaging in microtesla fields." Annu. Rev. Biomed. Eng. 9 (May 23, 2008): 389-413.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when Squid Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.

(56) References Cited

OTHER PUBLICATIONS

Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Mar. 15, 2017, from related U.S. Appl. No. 15/351,862, 6 pages.
U.S. Notice of Allowance dated May 26, 2017 from related U.S. Appl. No. 15/218,821, 7 pages.
U.S. Office Action dated Apr. 17, 2017, from related U.S. Appl. No. 15/003,558, 12 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 22, 2017, from related U.S. Appl. No. 15/003,206, 12 pages.
Wells, et al. "Assessing graphene nanopores for sequencing DNA." Nano letters 12.8 (Jul. 10, 2012): 4117-4123.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
PCT/US2015/021093, Mar. 17, 2015.
PCT/US2015/024265, Apr. 3, 2015.
PCT/US2015/024723, Apr. 7, 2015.
U.S. Appl. No. 14/866,730, filed Sep. 25, 2017.
U.S. Appl. No. 15/003,519, filed Jan. 21, 2016.
PCT/US2016/014389, Jan. 21, 2016.
PCT/US2016/014336, Jan. 21, 2016.
PCT/US2016/014403, Jan. 21, 2016.
PCT/US2016/014331, Jan. 21, 2016.
PCT/US2016/014387, Jan. 21, 2016.
PCT/US2016/014390, Jan. 21, 2016.
PCT/US2016/014385, Jan. 21, 2016.
PCT/US2016/014375, Jan. 21, 2016.
PCT/US2016/014298, Jan. 21, 2016.
PCT/US2016/014297, Jan. 21, 2016.
PCT/US2016/014377, Jan. 21, 2016.
PCT/US2016/014392, Jan. 21, 2016.
PCT/US2016/014395, Jan. 21, 2016.
PCT/US2016/014394, Jan. 21, 2016.
PCT/US2016/014386, Jan. 21, 2016.
PCT/US2016/014333, Jan. 21, 2016.
PCT/US2016/014328, Jan. 21, 2016.
PCT/US2016/014325, Jan. 21, 2016.
PCT/US2016/014330, Jan. 21, 2016.
PCT/US2016/014388, Jan. 21, 2016.
PCT/US2016/014380, Jan. 21, 2016.
PCT/US2016/014290, Jan. 21, 2016.
PCT/US2016/014363, Jan. 21, 2016.
PCT/US2016/014287, Jan. 21, 2016.
PCT/US2016/014291, Jan. 21, 2016.
PCT/US2016/014396, Jan. 21, 2016.
PCT/US2016/014384, Jan. 21, 2016.
PCT/US2016/014376, Jan. 21, 2016.
U.S. Appl. No. 15/204,675, filed Jul. 7, 2016.
U.S. Appl. No. 15/350,303, filed Nov. 14, 2016.
U.S. Appl. No. 15/351,862, filed Jul. 7, 2016.
U.S. Appl. No. 15/372,201, filed Dec. 7, 2016.
U.S. Appl. No. 15/376,244, filed Dec. 12, 2016.
PCT/US2016/066566, Dec. 14, 2016.
U.S. Appl. No. 15/380,691, filed Dec. 15, 2016.
U.S. Appl. No. 15/382,045, filed Dec. 16, 2016.
U.S. Appl. No. 15/380,419, filed Dec. 15, 2016.
PCT/US2016/068320, Dec. 22, 2016.
PCT/US2016/068344, Dec. 22, 2016.
PCT/US2016/068366, Dec. 22, 2016.
U.S. Appl. No. 15/419,832, filed Jan. 30, 2017.
U.S. Appl. No. 15/400,794, filed Jan. 6, 2017.
U.S. Appl. No. 15/443,422, filed Jan. 27, 2017.
PCT/US2017/017321, Feb. 10, 2017.
PCT/US2017/018099, Feb. 16, 2017.
U.S. Appl. No. 15/437,222, filed Feb. 20, 2017.
U.S. Appl. No. 15/437,038, filed Feb. 20, 2017.
PCT/US2017/018709, Feb. 21, 2017.
U.S. Appl. No. 15/440,194, filed Feb. 23, 2017.
PCT/US2017/019411, Feb. 24, 2017.
U.S. Appl. No. 15/446,373, filed Mar. 1, 2017.
U.S. Appl. No. 15/450,504, filed Mar. 6, 2017.
U.S. Appl. No. 15/454,162, filed Mar. 9, 2017.
PCT/US2017/021593, Mar. 9, 2017.
PCT/US2017/021811, Mar. 10, 2017.
U.S. Appl. No. 15/456,913, filed Mar. 13, 2017.
PCT/US2017/022118, Mar. 13, 2017.
PCT/US2017/022279, Mar. 14, 2017.
U.S. Appl. No. 15/468,356, filed Mar. 24, 2017.
U.S. Appl. No. 15/468,397, filed Mar. 24, 2017.
U.S. Appl. No. 15/468,386, filed Mar. 24, 2017.
U.S. Appl. No. 15/468,289, filed Mar. 24, 2017.
U.S. Appl. No. 15/468,641, filed Mar. 24, 2017.
U.S. Appl. No. 15/468,582, filed Mar. 24, 2017.
U.S. Appl. No. 15/468,410, filed Mar. 24, 2017.
U.S. Appl. No. 15/468,951, filed Mar. 24, 2017.
U.S. Appl. No. 15/468,559, filed Mar. 24, 2017.
U.S. Appl. No. 15/468,282, filed Mar. 24, 2017.
U.S. Appl. No. 15/468,314, filed Mar. 24, 2017.
U.S. Appl. No. 15/468,274, filed Mar. 24, 2017.
U.S. Appl. No. 15/468,303, filed Mar. 24, 2017.
U.S. Appl. No. 15/469,374, filed Mar. 24, 2017.
PCT/US17/24165, Mar. 24, 2017.
PCT/US17/24167, Mar. 24, 2017.
PCT/US17/24168, Mar. 24, 2017.
PCT/US17/24169, Mar. 24, 2017.
PCT/US17/24171, Mar. 24, 2017.
PCT/US17/24172, Mar. 24, 2017.
PCT/US17/18701, Feb. 21, 2017.
PCT/US17/24173, Mar. 24, 2017.
PCT/US17/24174, Mar. 24, 2017.
PCT/US17/24175, Mar. 24, 2017.
PCT/US17/24177, Mar. 24, 2017.
PCT/US17/24179, Mar. 24, 2017.
PCT/US17/24180, Mar. 24, 2017.
PCT/US17/24181, Mar. 24, 2017.
PCT/US17/24182, Mar. 24, 2017.
U.S. Appl. No. 15/476,636, filed Mar. 31, 2017.
U.S. Appl. No. 15/479,256, filed Apr. 4, 2017.
International Search Report and Written Opinion of the International Searching Authority in PCT/US2016/014390 dated Feb. 15, 2017.
Notice of Allowance dated Dec. 13, 2016, from related U.S. Appl. No. 14/680,877.
Notice of Allowance dated Dec. 22, 2016, from related U.S. Appl. No. 14/659,498.
U.S. Notice of Allowance dated Feb. 14, 2017, from related U.S. Appl. No. 15/003,677, 8 pages.
U.S. Office Action dated Feb. 10, 2017, from related U.S. Appl. No. 14/676,740, 38 pages.
U.S. Office Action dated Feb. 10, 2017, from related U.S. Appl. No. 15/003,088, 32 pages.
U.S. Office Action dated Feb. 16, 2017, from related U.S. Appl. No. 15/204,675, 15 pages.
U.S. Appl. No. 14/866,730, filed Sep. 25, 2016.
Acosta et al., "Broadband magnetometry by infrared-absorption detection of nitrogen-vacancy ensembles in diamond," Appl. Phys. Letters 97: 174104 (Oct. 29, 2010), 4 pages.
Barry et al., "Optical magnetic detection of single-neuron action potentials using quantum defects in diamond," as submitted to Quantum Physics on Feb. 2, 2016, 23 pages.
Constable, "Geomagnetic Spectrum, Temporal." In Encyclopedia of Geomagnetism and Paleomagnetism, pp. 353-355, Springer: Dordrecht, Netherlands (2007).

(56) References Cited

OTHER PUBLICATIONS

International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016 from related PCT application PCT/US2016/014363, 8 pages.
International Search Report and Written Opinion of the International Searching Authority dated Mar. 25, 2016 from related PCT application PCT/US2016/014389, 19 pages.
International Search Report and Written Opinion of the International Searching Authority dated Mar. 28, 2016 from related PCT application PCT/US2016/014380, 9 pages.
International Search Report and Written Opinion of the International Searching Authority dated Mar. 28, 2016 from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016, from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).
MacQuarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
U.S. Notice of Allowance dated Apr. 20, 2016, from related U.S. Appl. No. 15/003,718, 9 pages.
U.S. Notice of Allowance dated Mar. 29, 2016, from related U.S. Appl. No. 15/003,590, 11 pages.
U.S. Office Action dated Jul. 29, 2016 from related U.S. Appl. No. 14/680,877, 8 pages.
U.S. Office Action dated May 13, 2016, from related U.S. Appl. No. 14/676,740, 15 pages.
U.S. Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
U.S. Appl. No. 15/610,526, filed May 31, 2017.
PCT/US2017/035315, May 31, 2017.
U.S. Appl. No. 15/672,953, filed Aug. 9, 2017.
Bui et al., "Noninvasive Fault Monitoring of Electrical Machines by Solving the Steady-State Magnetic Inverse Problem," in IEEE Transactions on Magnetics, vol. 44, No. 6, pp. 1050-1053, Jun. 24, 2008.
Chadebec et al., "Rotor fault detection of electrical machines by low frequency magnetic stray field analysis," 2005 5th IEEE International Symposium on Diagnostics for Electric Machines, Power Electronics and Drives, Vienna, 2005, submitted Mar. 22, 2006, pp. 1-6.
Froidurot et al., "Magnetic discretion of naval propulsion machines," in IEEE Transactions on Magnetics, vol. 38, No. 2, pp. 1185-1188, Mar. 2002.
IEEE Std 802.11 TM-2012 Wireless LAN Medium Access Control (MAC) and Physical Layer (PHY) Specifications, 1 page.
Kwon et al., "Analysis of the far field of permanent-magnet motors and effects of geometric asymmetries and unbalance in magnet design," in IEEE Transactions on Magnetics, vol. 40, No. 2, pp. 435-442, Mar. 2004.

(56) References Cited

OTHER PUBLICATIONS

Maertz et al., "Vector magnetic field microscopy using nitrogen vacancy centers in diamond", Applied Physics Letters 96, No. 9, Mar. 1, 2010, pp. 092504-1-092504-3.
U.S. Notice of Allowance dated Feb. 2, 2018, from related U.S. Appl. No. 15/003,292, 8 pages.
U.S. Notice of Allowance dated Feb. 21, 2018, from related U.S. Appl. No. 15/003,176, 9 pages.
U.S. Office Action dated Feb. 1, 2018, from related U.S. Appl. No. 15/003,577, 16 pages.
U.S. Office Action dated Feb. 5, 2018, from related U.S. Appl. No. 15/450,504, 12 pages.
U.S. Office Action dated Jan. 25, 2018, from related U.S. Appl. No. 15/672,953, 28 pages.
U.S. Office Action dated Jan. 26, 2018, from related U.S. Appl. No. 15/003,678, 14 pages.
U.S. Office Action dated Mar. 27, 2018, from related U.S. Appl. No. 15/468,386, 21 pages.
U.S. Office Action dated Mar. 28, 2018, from related U.S. Appl. No. 15/003,177, 12 pages.
U.S. Office Action dated Mar. 5, 2018, from related U.S. Appl. No. 14/866,730, 14 pages.
U.S. Office Action dated Mar. 8, 2018, from related U.S. Appl. No. 15/380,691, 12 pages.
U.S. Office Action dated Mar. 8, 2018, from related U.S. Appl. No. 15/479,256, 30 pages.
Wegerich, "Similarity based modeling of time synchronous averaged vibration signals for machinery health monitoring," 2004 IEEE Aerospace Conference Proceedings (IEEE Cat. No. 04TH8720), 2004, pp. 3654-3662 vol. 6.
Wikipedia, "Continuous phase modulation", downloaded from https://web.archive.org/web/20151017015236/https://en.wikipedia.org/wiki/Continuous_phase_modulation on May 10, 2017, 3 pages.
Wikipedia, "Minimum-shift keying", downloaded from https://web.archive.org/web/20151017175828/https://en.wikipedia.org/wiki/Minimum-shift_keying on May 10, 2017, 2 pages.
U.S. Notice of Allowance dated Oct. 19, 2017, from related U.S. Appl. No. 15/179,957, 5 pages.
U.S. Notice of Allowance dated Oct. 23, 2017, from related U.S. Appl. No. 15/003,797, 6 pages.
U.S. Office Action dated Nov. 24, 2017, from related U.S. Appl. No. 15/003,145, 14 pages.
U.S. Office Action dated Nov. 27, 2017, from related U.S. Appl. No. 15/468,386, 28 pages.
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen-vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.
Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen-vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.
Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resoncance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.

(56) References Cited

OTHER PUBLICATIONS

Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., "Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.
Doherty, et al., "Theory of the ground-state spin of the NV-center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B, Nov. 2011.
Dreau, et al., "High-resolution spectroscopy of single NV defects coupled with nearby C-13 nuclear spins in diamond," Physical Review B, Apr. 2012.
Dumeige, et al., "Magnetometry with nitrogen—vacancy ensembles in diamond based on infrared absorption in a doubly resonant optical cavity," Physical Review B, Apr. 2013.
Epstein, et al., "Anisotropic interactions of a single spin and dark-spin spectroscopy in diamond," Center for Spintronics and Quantum Computation, 2005.
Fedotov, et al., "High-resolution magnetic field imaging with a nitrogen—vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.
Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect-From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.

Gould, et al., "An imaging magnetometer for bio-sensing based on nitrogen—vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen—Vacancy Centers in Diamond," Physical Review Letters, Nov. 2009.
Hanson, et al., "Coherent Dynamics of a single spin interacting with an adjustable spin bath," Sci. Am. Ass'n for the Advancement of Science, 2008.
Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.
Hobbs, "Study of the Environmental and Optical Durability of AR Microstructures in Sapphire, ALON, and Diamond," Proceedings of SPIE, 2009.
Huebener, et al., "ODMR of NV centers in nano-diamonds covered with N@C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.
Jensen, et al., "Light narrowing of magnetic resonances in ensembles of nitrogen—vacancy centers in diamond," Physical Review, Jan. 2013.
Kailath, "Linear Systems," Prentice Hall, 1979.
Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.
Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen—vacancy color centers in a diamond single-crystal," Applied Physics Letters, Sep. 2009.

(56) References Cited

OTHER PUBLICATIONS

Lai, et al., "Optically detected magnetic resonance of a single Nitrogen—Vacancy electronic spin in diamond nanocrystals," CLEO/EQEC, 2009.
Laraoui, et al., "Nitrogen—vacancy-assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen—vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
MacLaurin, et al., "Nanoscale magnetometry through quantum control of nitrogen-vacancy centres in rotationally diffusing nanodiamonds," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Massachusetts Institute of Technology; "Wide-Field Imaging Using Nitrogen Vacancies" in Patent Application Approval Process, Physics Week (2015).
Matsuda, et al., "Development of a plastic diamond anvil cell for high pressure magneto-photoluminescence in pulsed high magnetic fields," International Journal of Modern Physics B, Nov. 2004.
Maze et al., "Nanoscale magnetic sensing with an individual electronic spin in diamond," Nature Physics (2008).
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al., "Circularly polarized microwaves for magnetic resonance study in the GHz range: Application to nitrogen—vacancy in diamonds," Applied Physics Letters, Jul. 2015.
Nagl, et al., "Improving surface and defect center chemistry of fluorescent nanodiamonds for imaging purposes—a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H—(172) diamond cluster hosting nitrogen—vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(-)centre in diamond," New Journal of Physics, Jan. 2015.
Rondin, et al., "Magnetometry with nitrogen—vacancy defects in diamond," Reports on Progress in Physics, May 2014.
Rondin, et al., "Nanoscale magnetic field mapping with a single spin scanning probe magnetometer," Applied Physics Letters, Apr. 2012.
Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Steinert et al., "High-sensitivity magnetic imaging using an array of spins in diamond," Rev. Sci. Inst. (2010).
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen—vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.

(56) References Cited

OTHER PUBLICATIONS

Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen—vacancy centers in diamond for precision measurement of the components of a magnetic field vector," Technical Physics Letters, Nov. 2015.
Vershovskii & Dmitriev, "Micro-scale three-component quantum magnetometer based on nitrogen—vacancy color centers in diamond crystal," Technical Physics Letters, Apr. 2015.
Wang, et al., "Optimizing ultrasensitive single electron magnetometer based on nitrogen—vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen—vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen—vacancy spin in diamond," Nature Nanotechnology, Apr. 2011.
Teeling-Smith et al., "Electron Paramagnetic Resonance of a Single NV Nanodiamond Attached to an Individual Biomolecule", Biophysical Journal 110, May 10, 2016, pp. 2044-2052.
UK Office Action dated Jun. 8, 2018, from related application No. GB1617438.5, 3 pages.
US Final Office Action dated Jul. 26, 2018 from related U.S. Appl. No. 15/003,177, 14 pages.
US Non-Final Office Action dated Aug. 6, 2018 from related U.S. Appl. No. 15/376,244, 28 pages.
US Non-Final Office Action dated Aug. 9, 2018 from related U.S. Appl. No. 15/003,309, 22 pages.
US Non-Final Office Action dated Jul. 20, 2018 from related U.S. Appl. No. 15/350,303, 13 pages.
US Non-Final Office Action dated Jul. 26, 2018 from related U.S. Appl. No. 15/380,419, 11 pages.
US Non-Final Office Action dated Jul. 3, 2018 from related U.S. Appl. No. 15/003,396, 19 pages.
US Notice of Allowance dated Jul. 18, 2018 from related U.S. Appl. No. 15/468,386, 12 pages.
US Notice of Allowance dated Jul. 6, 2018 from related U.S. Appl. No. 15/672,953, 11 pages.
US Notice of Allowance dated May 15, 2018, from related U.S. Appl. No. 15/003,209, 7 pages.
US Notice of Allowance dated May 16, 2018, from related U.S. Appl. No. 15/003,145, 8 pages.
US Office Action dated Jun. 19, 2018, from related U.S. Appl. No. 15/450,504, 12 pages.
Niu, F., "Crack Detection of Power Line Based on Metal Magnetic Memory Non-destructive", Telkomnika Indonesian Journal of Electrical Engineering, Nov. 1, 2014, 12(11):7764-7771, abstract only.
Notice of Allowance for U.S. Appl. No. 14/866,730 dated Aug. 15, 2018, 9 pages.
Final Office Action for U.S. Appl. No. 15/479,256 dated Sep. 10, 2018, 20 pages.
Non-Final Office Action for U.S. Appl. No. 15/454,162 dated Sep. 10, 2018, 13 pages.
Extended European Search Report for EP 16743879.5, dated Sep. 11, 2018, 11 pages.
Final Office Action for U.S. Appl. No. 15/380691 dated Sep. 21, 2018, 12 pages.

\* cited by examiner

APPARATUS AND METHOD FOR CLOSED LOOP PROCESSING FOR A MAGNETIC DETECTION SYSTEM

CROSS-REFERENCE TO RELATED PATENT APPLICATION

This application claims the benefit of priority from U.S. Provisional Patent Application No. 62/258,003, filed Nov. 20, 2015, which is incorporated herein by reference in its entirety. This application is related to co-pending U.S. Patent Application filed Jan. 21, 2016, titled "APPARATUS AND METHOD FOR HYPERSENSITIVITY DETECTION OF MAGNETIC FIELD", which is incorporated by reference herein in its entirety.

FIELD

The present disclosure generally relates to magnetometers, and more particularly, to closed loop processing using hyperfine transition responses in a nitrogen vacancy diamond magnetic sensor.

BACKGROUND

Atomic-sized nitrogen-vacancy (NV) centers in diamond lattices have been shown to have excellent sensitivity for magnetic field measurement and enable fabrication of small magnetic sensors that can readily replace existing-technology (e.g., Hall-effect, SERF, SQUID, or the like) systems and devices. Nitrogen vacancy diamond (DNV) magnetometers are able to sense extremely small magnetic field variations by changes in the diamond's red photoluminescence that relate, through the gradient of the luminescent function, to frequency and thereafter to magnetic field through the Zeeman effect.

SUMMARY

According to certain embodiments, a system for magnetic detection may include a nitrogen vacancy (NV) diamond material comprising a plurality of NV centers, a magnetic field generator configured to generate a magnetic field that is applied to the NV diamond material, a radio frequency (RF) excitation source configured to provide RF excitation to the NV diamond material, an optical excitation source configured to provide optical excitation to the NV diamond material, an optical detector configured to receive an optical signal emitted by the NV diamond material, and a controller. The controller may be configured to compute a total incident magnetic field at the NV diamond material based on the optical signal emitted by the NV diamond material, and drive the magnetic field generator to generate a compensatory magnetic field, the generated compensatory magnetic field being set to offset a shift in the optical signal emitted by the NV diamond material caused by an external magnetic field.

According to one aspect, the compensatory magnetic field may be the inverse of the external magnetic field.

According to one aspect, a magnetic field generator may comprise a plurality of coils configured to generate a magnetic field having a plurality of predetermined directions.

According to one aspect, a plurality of coils may be configured to generate a magnetic field having three predetermined directions, wherein each of the predetermined directions are orthogonal to one another.

According to one aspect, an optical signal may be based on hyperfine states of the NV diamond material.

According to one aspect, a controller may be configured to detect a gradient of the optical signal based on the hyperfine states of the NV diamond material.

According to one aspect, a controller may be configured to detect a point of the largest gradient of the optical signal.

According to other embodiments, a method for magnetic detection using a nitrogen vacancy (NV) diamond material comprising a plurality of NV centers may include providing radio frequency (RF) excitation to the NV diamond material, providing optical excitation to the NV diamond material, receiving an optical signal emitted by the NV diamond material, computing a total incident magnetic field at the NV diamond material based on the optical signal emitted by the NV diamond material, and generating a compensatory magnetic field, the generated compensatory magnetic field being set to offset a shift in the optical signal emitted by the NV diamond material caused by an external magnetic field.

According to one aspect, an optical signal may be based on hyperfine states of the NV diamond material and the method may further comprise detecting a gradient of the optical signal based on the hyperfine states of the NV diamond material.

According to one aspect, a point of the largest gradient of the optical signal may be detected.

According to other embodiments, a system for magnetic detection may include a nitrogen vacancy (NV) diamond material comprising a plurality of NV centers, means for generating a compensatory magnetic field applied to the NV diamond material, means for providing radio frequency (RF) excitation to the NV diamond material, means for detecting an optical signal emitted by the NV diamond material, means for receiving the optical signal emitted by the NV diamond material, and means for computing a total incident magnetic field at the NV diamond material based on the optical signal emitted by the NV diamond material. The compensatory magnetic field is generated to offset a shift in the optical signal emitted by the NV diamond material caused by an external magnetic field.

According to one aspect, an optical signal may be based on hyperfine states of the NV diamond material.

According to one aspect, a system may further include means for detecting a point of the largest gradient of the optical signal based on the hyperfine states of the NV diamond material.

According to one aspect, a system may further include means for generating a bias magnetic field, and means for detecting a plurality of points of the largest gradients of the optical signal based on the hyperfine states of the NV diamond material for a plurality of NV diamond orientations.

According to other embodiments, a system for magnetic detection may include a nitrogen vacancy (NV) diamond material comprising a plurality of NV centers, a first magnetic field generator configured to generate a bias magnetic field that is applied to the NV diamond material, a second magnetic field generator configured to generate a compensatory magnetic field that is applied to the NV diamond material, a radio frequency (RF) excitation source configured to provide RF excitation to the NV diamond material, an optical excitation source configured to provide optical excitation to the NV diamond material, an optical detector configured to receive an optical signal emitted by the NV diamond material, and a controller. The controller may be configured to compute a total incident magnetic field at the NV diamond material based on the optical signal emitted by the NV diamond material, detect a shift in the optical signal emitted by the NV diamond material due to an external magnetic field, and drive the second magnetic field generator to generate the compensatory magnetic field to offset the shift in the optical signal emitted by the NV diamond material caused by the external magnetic field.

According to one aspect, a compensatory magnetic field may be the inverse of the external magnetic field.

According to one aspect, a second magnetic field generator may comprise a plurality of coils configured to generate a magnetic field having a plurality of predetermined directions.

According to one aspect, a plurality of coils may be configured to generate a magnetic field having three predetermined directions, wherein each of the predetermined directions are orthogonal to one another.

According to one aspect, a first magnetic field generator may be a permanent magnet.

According to one aspect, an optical signal may be based on hyperfine states of the NV diamond material.

According to one aspect, a controller may be configured to detect a point of the largest gradient of the optical signal based on the hyperfine states of the NV diamond material.

According to other embodiments, a method for magnetic detection using a nitrogen vacancy (NV) diamond material comprising a plurality of NV centers may include providing radio frequency (RF) excitation to the NV diamond material, providing optical excitation to the NV diamond material, receiving an optical signal emitted by the NV diamond material, computing a total incident magnetic field at the NV diamond material based on the optical signal emitted by the NV diamond material, detecting a shift in the optical signal emitted by the NV diamond material due to an external magnetic field, and generating a compensatory magnetic field. The generated compensatory magnetic field may be set to offset the shift in the optical signal emitted by the NV diamond material caused by the external magnetic field.

According to other embodiments, a system for magnetic detection may include a nitrogen vacancy (NV) diamond material comprising a plurality of NV centers, a magnetic field generator configured to generate a magnetic field, a radio frequency (RF) excitation source configured to provide RF excitation to the NV diamond material, an optical excitation source configured to provide optical excitation to the NV diamond material, an optical detector configured to receive an optical signal emitted by the NV diamond material, wherein the optical signal is based on hyperfine states of the NV diamond material, and a controller. The controller may be configured to compute a total incident magnetic field at the NV diamond material based on a point of the largest gradient of the hyperfine states of the NV diamond material, detect a shift of the optical signal emitted by the NV diamond material due to an external magnetic field, and drive the magnetic field generator to generate a compensatory magnetic field, the generated compensatory magnetic field being set to offset the shift in the optical signal emitted by the NV diamond material caused by the external magnetic field.

According to one aspect, a controller may be further configured to drive the magnetic field generator to generate a bias magnetic field, the bias magnetic field being configured to separate the optical signal based on the hyperfine states of the NV diamond material for a plurality of NV diamond orientations.

According to yet another embodiment, a system for magnetic detection may include a nitrogen vacancy (NV) diamond material comprising a plurality of NV centers, a radio frequency (RF) excitation source configured to provide RF excitation to the NV diamond material, an optical excitation source configured to provide optical excitation to the NV diamond material, an optical detector configured to receive an optical signal emitted by the NV diamond material, wherein the optical signal is based on hyperfine states of the NV diamond material, a first magnetic field generator configured to generate a bias magnetic field, the bias magnetic field being configured to separate the optical signal based on the hyperfine states of the NV diamond material for a plurality of NV diamond orientations, a second magnetic field generator configured to generate a compensatory magnetic field, and a controller. The controller may be configured to compute a total incident magnetic field at the NV diamond material based on a point of the largest gradient of the optical signal based on the hyperfine states of the NV diamond material for the plurality of NV diamond orientations, detect a shift of the optical signal emitted by the NV diamond material due to an external magnetic field, and drive the magnetic field generator to generate a compensatory magnetic field, the generated compensatory magnetic field being set to offset the shift in the optical signal emitted by the NV diamond material caused by the external magnetic field.

According to yet another embodiment, a system for magnetic detection may include a magneto-optical defect center material comprising a plurality of magneto-optical defect centers, a magnetic field generator configured to generate a magnetic field that is applied to the magneto-optical defect center material, a radio frequency (RF) excitation source configured to provide RF excitation to the magneto-optical defect center material, an optical excitation source configured to provide optical excitation to the magneto-optical defect center material, an optical detector configured to receive an optical signal emitted by the magneto-optical defect center material, and a controller. The controller may be configured to compute a total incident magnetic field at the magneto-optical defect center material based on the optical signal emitted by the magneto-optical defect center material, and drive the magnetic field generator to generate a compensatory magnetic field, the generated compensatory magnetic field being set to offset a shift in the optical signal emitted by the magneto-optical defect center material caused by an external magnetic field.

DETAILED DESCRIPTION

The present disclosure generally relates to apparatuses and methods for elucidating hyperfine transition responses to determine an external magnetic field acting on a magnetic detection system. The hyperfine transition responses may exhibit a steeper gradient than the gradient of aggregate Lorentzian responses measured in conventional systems, which can be up to three orders of magnitude larger. Thus, the hyperfine responses can allow for greater sensitivity in detecting changes in the external magnetic field. In certain embodiments, the detection of the hyperfine responses is then used in a closed loop processing to estimate the external magnetic field in real-time. This may be done by applying a compensatory field via a magnetic field generator controlled by a controller that offsets any shifts in the hyperfine responses that occur due to changes in the external magnetic field. In the closed loop processing, the controller continually monitors the hyperfine responses and, based on a computed estimated total magnetic field acting on the system, provides a feedback to the magnetic field generator to generate a compensatory field that is equal and opposite in sign to the vector components of the external magnetic field in order to fix the hyperfine responses despite changes in the external magnetic field. This, in turn, provides a real-time calculation of the external magnetic field in the form of the calculated inverted compensatory field. Moreover, by fixing the hyperfine responses despite changes in the external magnetic field, a smaller bias magnetic field, which separates out the hyperfine responses to provide sufficient spacing for tracking purposes, may be utilized. The application of a smaller bias magnetic field reduces the frequency range needed for the radiofrequency excitation sweep and measurement circuits, thus providing a system that is more responsive and efficient in determining the external magnetic field acting on the system.

The NV Center, its Electronic Structure, and Optical and RF Interaction

Figure 1:
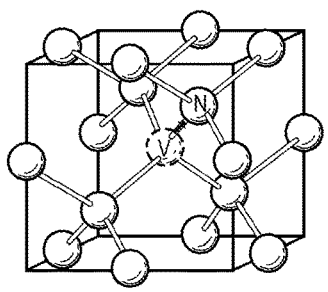
FIG. 1 illustrates one orientation of an NV center in a diamond lattice.

The NV center in a diamond comprises a substitutional nitrogen atom in a lattice site adjacent a carbon vacancy as shown in FIG. 1. The NV center may have four orientations, each corresponding to a different crystallographic orientation of the diamond lattice.

The NV center may exist in a neutral charge state or a negative charge state. Conventionally, the neutral charge state uses the nomenclature $NV^0$, while the negative charge state uses the nomenclature NV, which is adopted in this description.

The NV center has a number of electrons, including three unpaired electrons, each one from the vacancy to a respective of the three carbon atoms adjacent to the vacancy, and a pair of electrons between the nitrogen and the vacancy. The NV center, which is in the negatively charged state, also includes an extra electron.

Figure 2:
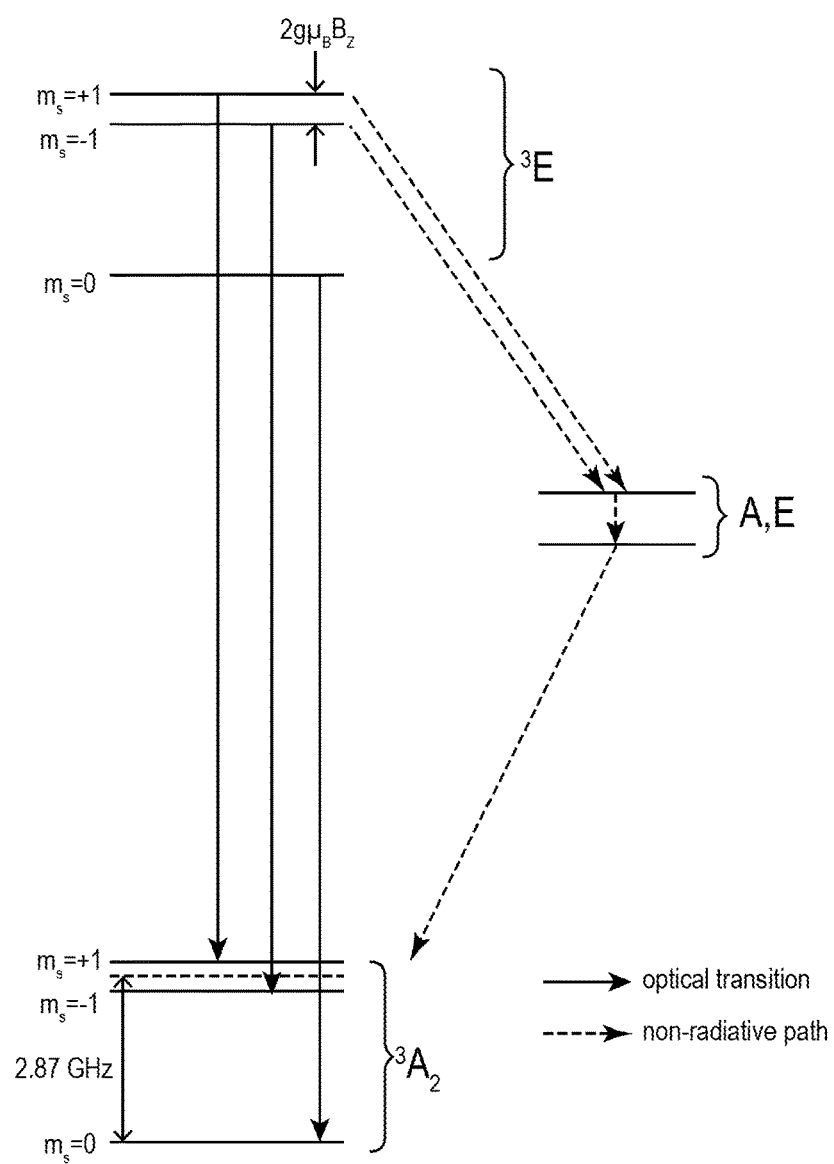
FIG. 2 is an energy level diagram showing energy levels of spin states for the NV center.

The NV center has rotational symmetry, and as shown in FIG. 2, has a ground state, which is a spin triplet with $^3A_2$ symmetry with one spin state $m_s=0$, and two further spin states $m_s=+1$, and $m_s=-1$. In the absence of an external magnetic field, the $m_s=\pm 1$ energy levels are offset from the $m_s=0$ due to spin-spin interactions, and the $m_s=\pm 1$ energy levels are degenerate, i.e., they have the same energy. The $m_s=0$ spin state energy level is split from the $m_s=\pm 1$ energy levels by an energy of 2.87 GHz for a zero external magnetic field.

Introducing an external magnetic field with a component along the NV axis lifts the degeneracy of the $m_s=\pm 1$ energy levels, splitting the energy levels $m_s=\pm 1$ by an amount $2g\mu_B Bz$, where g is the g-factor, $\mu_B$ is the Bohr magneton, and Bz is the component of the external magnetic field along the NV axis. This relationship is correct to a first order and inclusion of higher order corrections is a straightforward matter and will not affect the computational and logic steps in the systems and methods described below.

The NV center electronic structure further includes an excited triplet state $^3E$ with corresponding $m_s=0$ and $m_s=\pm 1$ spin states. The optical transitions between the ground state $^3A_2$ and the excited triplet $^3E$ are predominantly spin conserving, meaning that the optical transitions are between initial and final states that have the same spin. For a direct transition between the excited triplet $^3E$ and the ground state $^3A_2$, a photon of red light is emitted with a photon energy corresponding to the energy difference between the energy levels of the transitions.

There is, however, an alternative non-radiative decay route from the triplet $^3E$ to the ground state $^3A_2$ via intermediate electron states, which are thought to be intermediate singlet states A, E with intermediate energy levels. Significantly, the transition rate from the $m_s=\pm 1$ spin states of the excited triplet $^3E$ to the intermediate energy levels is significantly greater than the transition rate from the $m_s=0$ spin state of the excited triplet $^3E$ to the intermediate energy levels. The transition from the singlet states A, E to the ground state triplet $^3A_2$ predominantly decays to the $m_s=0$ spin state over the $m_s=\pm 1$ spins states. These features of the decay from the excited triplet $^3E$ state via the intermediate singlet states A, E to the ground state triplet $^3A_2$ allows that if optical excitation is provided to the system, the optical excitation will eventually pump the NV center into the $m_s=0$ spin state of the ground state $^3A_2$. In this way, the population of the $m_s=0$ spin state of the ground state $^3A_2$ may be "reset" to a maximum polarization determined by the decay rates from the triplet $^3E$ to the intermediate singlet states.

Another feature of the decay is that the fluorescence intensity due to optically stimulating the excited triplet $^3E$ state is less for the $m_s=\pm 1$ states than for the $m_s=0$ spin state. This is so because the decay via the intermediate states does not result in a photon emitted in the fluorescence band, and because of the greater probability that the $m_s=\pm 1$ states of the excited triplet $^3E$ state will decay via the non-radiative decay path. The lower fluorescence intensity for the $m_s=\pm 1$ states than for the $m_s=0$ spin state allows the fluorescence intensity to be used to determine the spin state. As the population of the $m_s=\pm 1$ states increases relative to the $m_s=0$ spin, the overall fluorescence intensity will be reduced.

The NV Center, or Magneto-Optical Defect Center, Magnetic Sensor System

Figure 3:
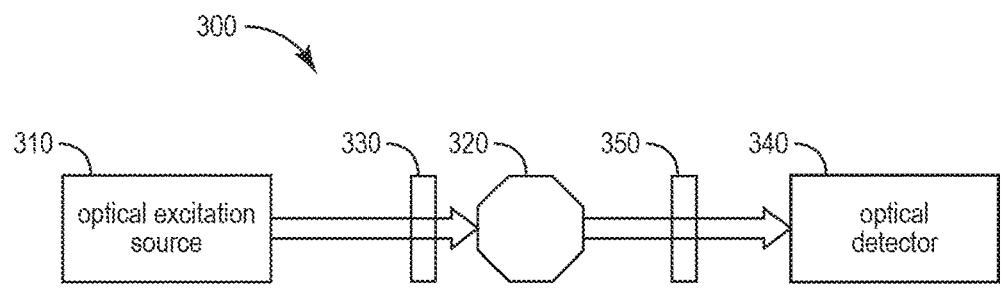
FIG. 3 is a schematic illustrating an NV center magnetic sensor system.

FIG. 3 is a schematic diagram illustrating a conventional NV center magnetic sensor system 300 that uses fluorescence intensity to distinguish the $m_s=\pm1$ states, and to measure the magnetic field based on the energy difference between the $m_s=+1$ state and the $m_s=-1$ state. The system 300 includes an optical excitation source 310, which directs optical excitation to an NV diamond material 320 with NV centers. The system further includes an RF excitation source 330, which provides RF radiation to the NV diamond material 320. Light from the NV diamond may be directed through an optical filter 350 to an optical detector 340.

The RF excitation source 330 may be a microwave coil, for example. The RF excitation source 330, when emitting RF radiation with a photon energy resonant with the transition energy between ground $m_s=0$ spin state and the $m_s=+1$ spin state, excites a transition between those spin states. For such a resonance, the spin state cycles between ground $m_s=0$ spin state and the $m_s=+1$ spin state, reducing the population in the $m_s=0$ spin state and reducing the overall fluorescence at resonances. Similarly, resonance occurs between the $m_s=0$ spin state and the $m_s=-1$ spin state of the ground state when the photon energy of the RF radiation emitted by the RF excitation source is the difference in energies of the $m_s=0$ spin state and the $m_s=-1$ spin state, or between the $m_s=0$ spin state and the $m_s=+1$ spin state, there is a decrease in the fluorescence intensity.

The optical excitation source 310 may be a laser or a light emitting diode, for example, which emits light in the green, for example. The optical excitation source 310 induces fluorescence in the red, which corresponds to an electronic transition from the excited state to the ground state. Light from the NV diamond material 320 is directed through the optical filter 350 to filter out light in the excitation band (in the green, for example), and to pass light in the red fluorescence band, which in turn is detected by the detector 340. The optical excitation light source 310, in addition to exciting fluorescence in the diamond material 320, also serves to reset the population of the $m_s=0$ spin state of the ground state $^3A_2$ to a maximum polarization, or other desired polarization.

Figure 4:
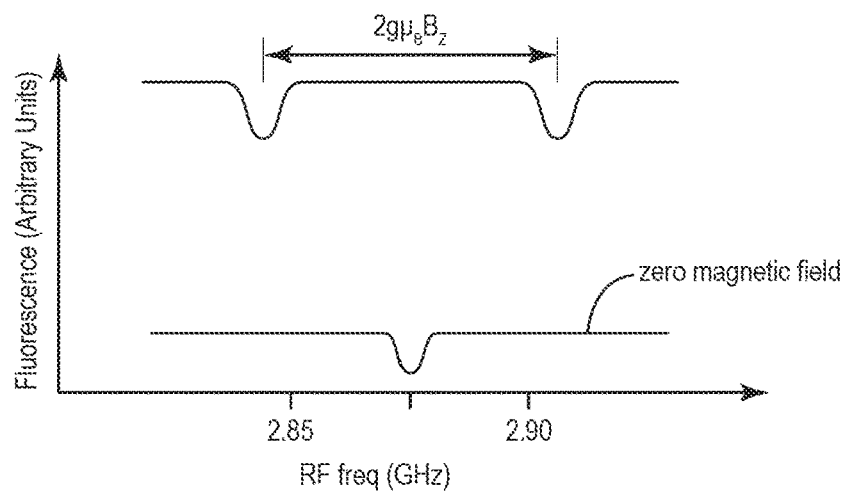
FIG. 4 is a graph illustrating a fluorescence as a function of an applied RF frequency of an NV center along a given direction for a zero magnetic field.

For continuous wave excitation, the optical excitation source 310 continuously pumps the NV centers, and the RF excitation source 330 sweeps across a frequency range that includes the zero splitting (when the $m_s=\pm1$ spin states have the same energy) energy of 2.87 GHz. The fluorescence for an RF sweep corresponding to a diamond material 320 with NV centers aligned along a single direction is shown in FIG. 4 for different magnetic field components Bz along the NV axis, where the energy splitting between the $m_s=-1$ spin state and the $m_s=+1$ spin state increases with Bz. Thus, the component Bz may be determined. Optical excitation schemes other than continuous wave excitation are contemplated, such as excitation schemes involving pulsed optical excitation, and pulsed RF excitation. Examples of pulsed excitation schemes include Ramsey pulse sequence, and spin echo pulse sequence.

Figure 5:
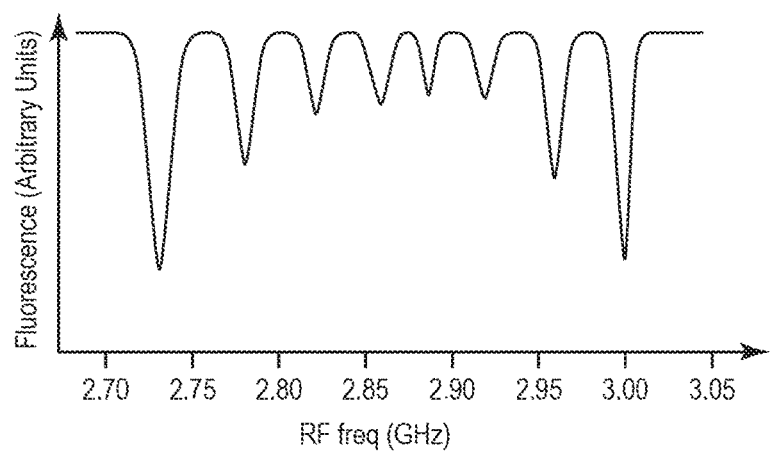
FIG. 5 is a graph illustrating the fluorescence as a function of an applied RF frequency for four different NV center orientations for a non-zero magnetic field.

In general, the diamond material 320 will have NV centers aligned along directions of four different orientation classes. FIG. 5 illustrates fluorescence as a function of RF frequency for the case where the diamond material 320 has NV centers aligned along directions of four different orientation classes. In this case, the component Bz along each of the different orientations may be determined. These results, along with the known orientation of crystallographic planes of a diamond lattice, allow not only the magnitude of the external magnetic field to be determined, but also the direction of the magnetic field.

While FIG. 3 illustrates an NV center magnetic sensor system 300 with NV diamond material 320 with a plurality of NV centers, in general, the magnetic sensor system may instead employ a different magneto-optical defect center material, with a plurality of magneto-optical defect centers. The electronic spin state energies of the magneto-optical defect centers shift with magnetic field, and the optical response, such as fluorescence, for the different spin states is not the same for all of the different spin states. In this way, the magnetic field may be determined based on optical excitation, and possibly RF excitation, in a corresponding way to that described above with NV diamond material.

Figure 6:
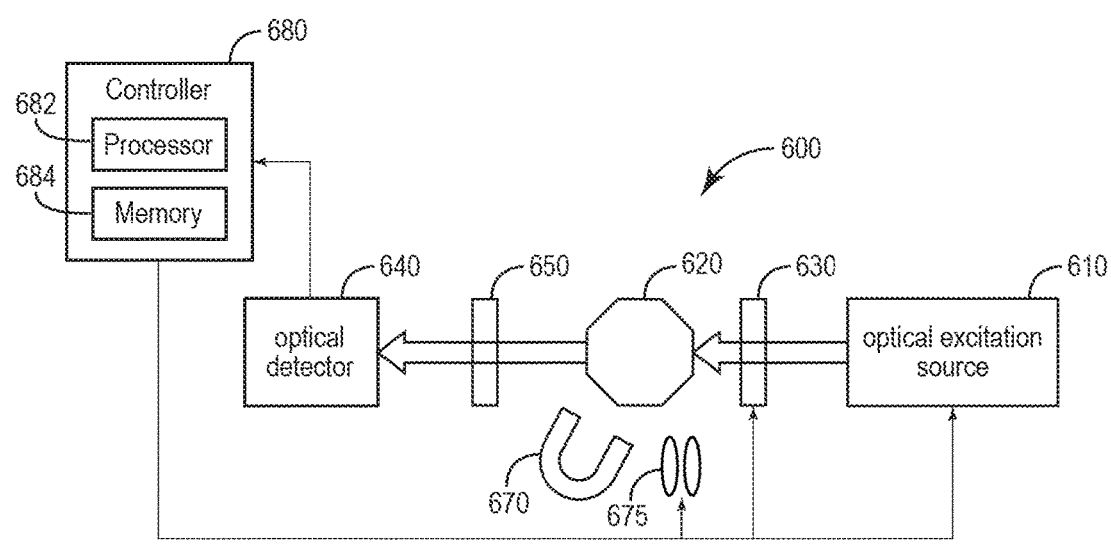
FIG. 6 is a schematic diagram illustrating a magnetic field detection system according to an embodiment of the present invention.

FIG. 6 is a schematic diagram of a system 600 for a magnetic field detection system according to an embodiment of the present invention. The system 600 includes an optical excitation source 610, which directs optical excitation to an NV diamond material 620 with NV centers, or another magneto-optical defect center material with magneto-optical defect centers. An RF excitation source 630 provides RF radiation to the NV diamond material 620.

As shown in FIG. 6, a first magnetic field generator 670 generates a magnetic field, which is detected at the NV diamond material 620. The first magnetic field generator 670 may be a permanent magnet positioned relative to the NV diamond material 620, which generates a known, uniform magnetic field (e.g., a bias or control magnetic field) to produce a desired fluorescence intensity response from the NV diamond material 620. In some embodiments, a second magnetic field generator 675 may be provided and positioned relative to the NV diamond material 620 to provide an additional bias or control magnetic field. The second magnetic field generator 675 may be configured to generate magnetic fields with orthogonal polarizations, for example. In this regard, the second magnetic field generator 675 may include one or more coils, such as a Helmholtz coils. The coils may be configured to provide relatively uniform magnetic fields at the NV diamond material 620 and each may generate a magnetic field having a direction that is orthogonal to the direction of the magnetic field generated by the other coils. For example, in a particular embodiment, the second magnetic field generator 675 may include three Helmholtz coils that are arranged to each generate a magnetic field having a direction orthogonal to the other direction of the magnetic field generated by the other two coils resulting in a three-axis magnetic field. In some embodiments, only the first magnetic field generator 670 may be provided to generate a bias or control magnetic field. Alternatively, only the second magnetic field generator 675 may be provided to generate the bias or control magnetic field. In yet other embodiments, the first and/or second magnetic field generators may be affixed to a pivot assembly (e.g., a gimbal assembly) that may be controlled to hold and position the first and/or second magnetic field generators to a predetermined and well-controlled set of orientations, thereby establishing the desired bias or control magnetic field. In this case, the controller 680 may be configured to control the pivot assembly having the first and/or second magnetic field generators to position and hold the first and/or second magnetic field generators at the predetermined orientation.

The system 600 further includes a controller 680 arranged to receive a light detection or optical signal from the optical detector 640 and to control the optical excitation source 610, the RF excitation source 630, and the second magnetic field generator 675. The controller may be a single controller, or multiple controllers. For a controller including multiple controllers, each of the controllers may perform different functions, such as controlling different components of the system 600. The second magnetic field generator 675 may be controlled by the controller 680 via an amplifier 660, for example.

The RF excitation source 630 may be a microwave coil, for example. The RF excitation source 630 is controlled to emit RF radiation with a photon energy resonant with the transition energy between the ground $m_s=0$ spin state and the $m_s=\pm 1$ spin states as discussed above with respect to FIG. 3.

The optical excitation source 610 may be a laser or a light emitting diode, for example, which emits light in the green, for example. The optical excitation source 610 induces fluorescence in the red from the NV diamond material 620, where the fluorescence corresponds to an electronic transition from the excited state to the ground state. Light from the NV diamond material 620 is directed through the optical filter 650 to filter out light in the excitation band (in the green, for example), and to pass light in the red fluorescence band, which in turn is detected by the optical detector 640. The optical excitation light source 610, in addition to exciting fluorescence in the NV diamond material 620, also serves to reset the population of the $m_s=0$ spin state of the ground state $^3A_2$ to a maximum polarization, or other desired polarization.

The controller 680 is arranged to receive a light detection signal from the optical detector 640 and to control the optical excitation source 610, the RF excitation source 630, and the second magnetic field generator 675. The controller may include a processor 682 and a memory 684, in order to control the operation of the optical excitation source 610, the RF excitation source 630, and the second magnetic field generator 675. The memory 684, which may include a nontransitory computer readable medium, may store instructions to allow the operation of the optical excitation source 610, the RF excitation source 630, and the second magnetic field generator 675 to be controlled. That is, the controller 680 may be programmed to provide control.

Detection of Magnetic Field Changes

As discussed above, the interaction of the NV centers with an external magnetic field results in an energy splitting between the $m_s=-1$ spin state and the $m_s=+1$ spin state that increases with Bz as shown in FIG. 4, for example. The pair of frequency responses (also known as Lorentzian responses, profiles, or dips) due to the component of the external magnetic field along the given NV axis manifest as dips in intensity of the emitted red light from the NV centers as a function of RF carrier frequency. Accordingly, a pair of frequency responses for each of the four axes of the NV center diamond lattice result in an energy splitting between the $m_s=-1$ spin state and the $m_s=+1$ spin state that corresponds to the component of the external magnetic field along the axis for a total of eight Lorentzian profiles or dips, as shown in FIG. 5. When a bias magnetic field is applied to the NV diamond material (such as by the first and/or second magnetic field generators 670, 675 of FIG. 6), in addition to an unknown external magnetic field existing outside the system, the total incident magnetic field may thus be expressed as $B_t(t)=B_{bias}(t)+B_{ext}(t)$, where $B_{bias}(t)$ represents the bias magnetic field applied to the NV diamond material and $B_{ext}(t)$ represents the unknown external magnetic field. This total incident magnetic field creates equal and linearly proportional shifts in the Lorentzian frequency profiles for a given NV axis between the $m_s=-1$ spin state and the $m_s=+1$ spin state relative to the starting carrier frequency (e.g., about 2.87 GHz).

Figure 7:
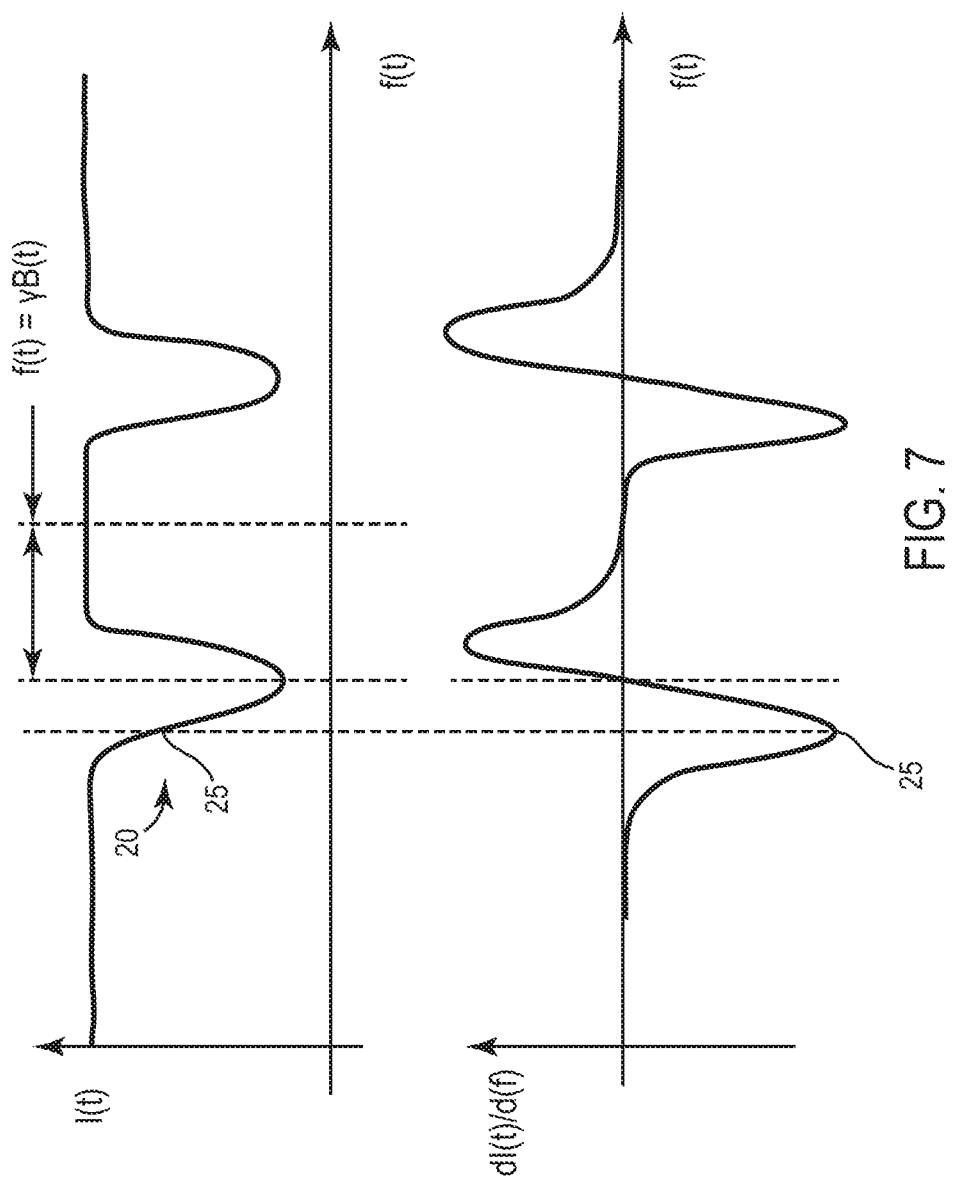
FIG. 7 is a graph illustrating a fluorescence as a function of an applied RF frequency for an NV center orientation in a non-zero magnetic field and a gradient of the fluorescence as a function of the applied RF frequency.

Because the applied bias magnetic field $B_{bias}(t)$ is already known and constant, a change or shift in the total incident magnetic field $B_t(t)$ will be due to a change in the external magnetic field $B_{ext}(t)$. To detect a change in the total incident magnetic field, the point of greatest sensitivity in measuring such a change will occur at the point where the frequency response is at its largest slope. For example, as shown in FIG. 7, an intensity response I(t) as a function of an RF applied frequency f(t) for a given NV axis due to a magnetic field is shown in the top graph. The change in intensity I(t) relative to the change in RF applied frequency, $$\frac{dI(t)}{df},$$

is plotted against the RF applied frequency f(t) as shown in the bottom graph. Point 25 represents the point of the greatest gradient of the Lorentzian dip 20. This point gives the greatest measurement sensitivity in detecting changes in the total incident magnetic field as it responds to the external magnetic field.

The Hyperfine Field

Figure 8:
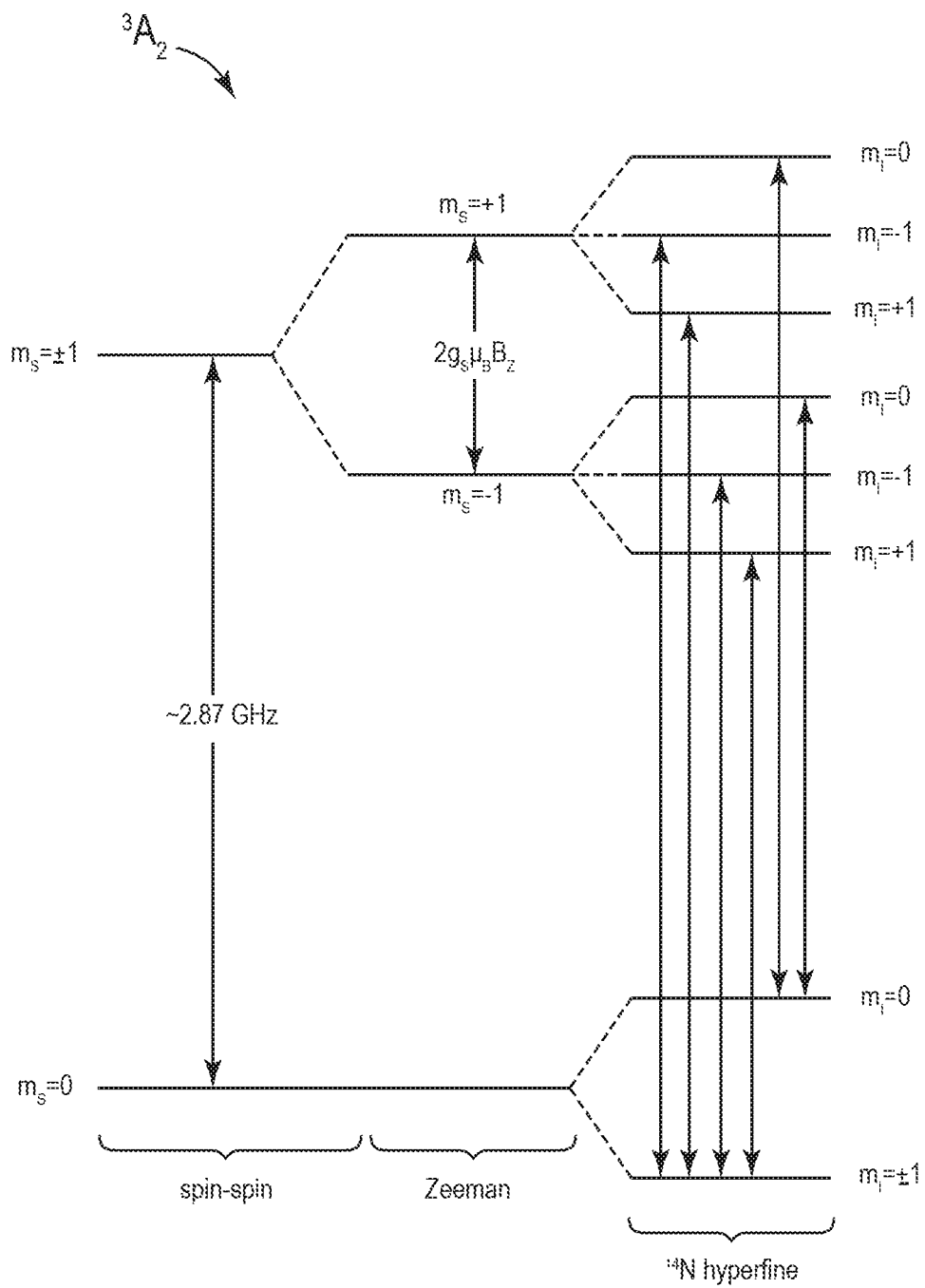
FIG. 8 is an energy level diagram showing a hyperfine structure of spin states for the NV center.

As discussed above and shown in the energy level diagram of FIG. 2, the ground state is split by about 2.87 GHz between the $m_s=0$ and $m_s=\pm 1$ spin states due to their spin-spin interactions. In addition, due to the presence of a magnetic field, the $m_s=\pm 1$ spin states split in proportion to the magnetic field along the given axis of the NV center, which manifests as the four-pair Lorentzian frequency response shown in FIG. 5. However, a hyperfine structure of the NV center exists due to the hyperfine coupling between the electronic spin states of the NV center and the nitrogen nucleus, which results in further energy splitting of the spin states. FIG. 8 shows the hyperfine structure of the ground state triplet $^3A_2$ of the NV center. Specifically, coupling to the nitrogen nucleus $^{14}N$ further splits the $m_s=\pm 1$ spin states into three hyperfine transitions (labeled as $m_1$ spin states), each having different resonances. Accordingly, due to the hyperfine split for each of the $m_s=\pm 1$ spin states, twenty-four different frequency responses may be produced (three level splits for each of the $m_s=\pm 1$ spin states for each of the four NV center orientations).

Each of the three hyperfine transitions manifest within the width of one aggregate Lorentzian dip. With proper detection, the hyperfine transitions may be elucidated within a given Lorentzian response. To detect such hyperfine transitions, in particular embodiments, the NV diamond material 620 exhibits a high purity (e.g., low existence of lattice dislocations, broken bonds, or other elements beyond $^{14}N$) and does not have an excess concentration of NV centers. In addition, during operation of the system 600 in some embodiments, the RF excitation source 630 is operated on a low power setting in order to further resolve the hyperfine responses. In other embodiments, additional optical contrast for the hyperfine responses may be accomplished by increasing the concentration of NV negative-charge type centers, increasing the optical power density (e.g., in a range from about 20 to about 1000 mW/mm$^2$), and decreasing the RF power to the lowest magnitude that permits a sufficient hyperfine readout (e.g., about 1 to about 10 W/mm$^2$).

Figure 9:
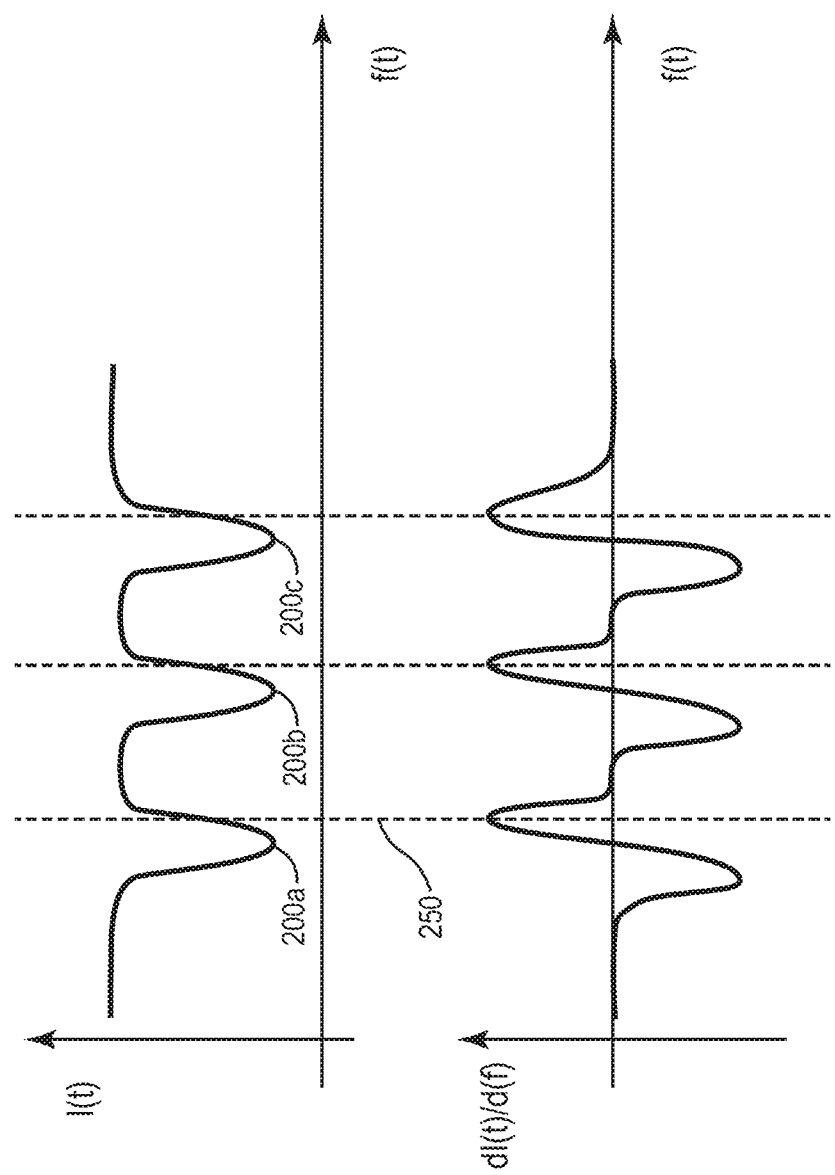
FIG. 9 is a graph illustrating a fluorescence as a function of an applied RF frequency for an NV center orientation in a non-zero magnetic field with hyperfine detection and a gradient of the fluorescence as a function of the applied RF frequency.

FIG. 9 shows an example of fluorescence intensity as a function of an applied RF frequency for an NV center with hyperfine detection. In the top graph, the intensity response I(t) as a function of an applied RF frequency f(t) for a given spin state (e.g., $m_s=-1$) along a given axis of the NV center due to an external magnetic field is shown. In addition, in the bottom graph, the gradient $$\frac{dI(t)}{df}$$

plotted against the applied RF frequency f(t) is shown. As seen in the figure, the three hyperfine transitions 200a-200c constitute a complete Lorenztian response 20 (e.g., corresponding to the Lorenztian response 20 in FIG. 7). The point of maximum slope may then be determined through the gradient of the fluorescence intensity as a function of the applied RF frequency, which occurs at the point 250 in FIG. 9. This point of maximum slope may then be tracked during the applied RF sweep to detect movement of the point of maximum slope along the frequency sweep. Like the point of maximum slope 25 for the aggregate Lorentzian response, the corresponding movement of the point 250 corresponds to changes in the total incident magnetic field $B_t(t)$, which because of the known and constant bias field $B_{bias}(t)$, allows for the detection of changes in the external magnetic field $B_{ext}(t)$.

However, as compared to point 25, point 250 exhibits a larger gradient than the aggregate Lorentzian gradient described above with regard to FIG. 7. In some embodiments, the gradient of point 250 may be up to 1000 times larger than the aggregate Lorentzian gradient of point 25. Due to this, the point 250 and its corresponding movement may be more easily detected by the measurement system resulting in improved sensitivity, especially in very low magnitude and/or very rapidly changing magnetic fields.

Closed Loop Processing of External Magnetic Field

As discussed above, current methods in determining the total incident magnetic field $B_t(t)$ examine the fluorescence intensity as a function of applied RF frequency based on the movement of the point of greatest gradient of the aggregate Lorentzian response (e.g., point 25 of Lorentzian dip 20 of FIG. 7). By fine-tuning the point of measurement to be the hyperfine transition, greater sensitivity in this tracking may be achieved. An example of an open-loop or ad-hoc processing method to estimate the vector components of the total magnetic field $B_t(t)$ on the NV center magnetic sensor system is shown in FIG. 10.

When in a zero magnetic field (i.e., $B_t(t)=0$), the Lorentzian responses for each of the $m_s=\pm 1$ spin states along the four axes of the NV center overlap at the same frequency (e.g., about 2.87 GHz). To pre-separate and space (e.g., equally) the eight Lorentzian responses for tracking purposes, a bias or control magnetic field $B_{bias}(t)$ may be applied. The first magnetic field generator (e.g., a permanent magnet) 670 and/or the second magnetic field generator (e.g., a three-axis Cartesian $B_{bias}(t)$ Helmholtz coil system) 675, as shown in the system 600 of FIG. 6, may be used to apply the desired bias field. As discussed above, the second magnetic field generator 675 is electrically connected to the controller 680, by which the magnetic field produced by the second magnetic field generator 675 may be controlled by the controller 680.

Figure 10:
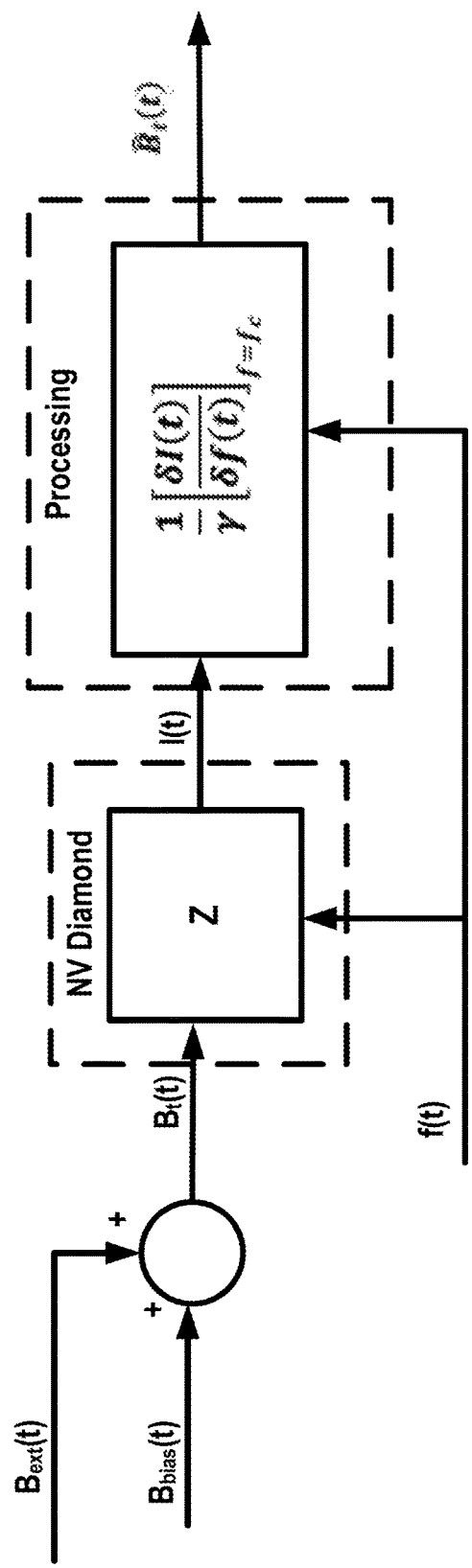
FIG. 10 is a signal flow block diagram of an open loop processing of the total incident magnetic field on the NV center magnetic sensor system.

As shown in FIG. 10, during the open-loop processing, the sum of the external magnetic field $B_{ext}(t)$ and the bias magnetic field $B_{bias}(t)$, represented by the total incident magnetic field $B_t(t)$, acts on the NV center magnetic sensor system 600, which linearly converts to an intensity response I(t) due to the Zeeman effect Z that, in conjunction with the applied RF frequency f(t), results in the aggregate Lorentzian curves or the Lorentzian hyperfine curves at the corresponding resonance frequencies, as discussed in greater detail above. Processing is then performed by the system controller 680 by operating on the Lorentzian gradient to determine an estimate of the total incident magnetic field $\hat{B}(t)$. The total incident magnetic field may be linearly expressed as:

$$B_t(t) = \frac{1}{\gamma} f(t) \qquad (1)$$

Where, in equation (1), γ represents the nitrogen vacancy gyromagnetic ratio of about 28 GHz/T. The maximum gradient or slope may be determined by the Jacobian operator evaluated at a critical frequency $f_c$ where the Lorentzian aggregate or hyperfine slope is the greatest:

$$f(t) = \nabla^f (I(t)) I(t) = \left[\frac{\delta I(t)}{\delta f(t)}\right]_{f=f_c} I(t) \qquad (2)$$

The critical frequency $f_c$ is determined analytically based on the NV diamond material 620 incorporated into the sensor system and is pre-stored in the controller 680 for processing purposes. Thus, the total incident magnetic field may be estimated according to the critical frequency:

$$\hat{B}_t(t) = \frac{1}{\gamma} \left[\frac{\delta I(t)}{\delta f(t)}\right]_{f=f_c} I(t) \qquad (3)$$

As can be seen from equations (1) to (3), the relationship between the actual total incident field $B_t(t)$ and the estimated total incident field $\hat{B}_t(t)$ is more accurate the larger the intensity to frequency gradient magnitude. Thus, by evaluating the critical frequency $f_c$ at the point of greatest slope of the hyperfine response, rather than the point of greater slope of the aggregate Lorentzian response, a more accurate estimation of the total incident field $\hat{B}_t(t)$ may be obtained.

However, at this point, computing the difference in effect on the Lorentzian responses from the bias magnetic field $B_{bias}(t)$ and the external magnetic field $B_{ext}(t)$ is difficult as the total vector sum of the two fields cause the overall shift between Lorentzian responses. Thus, the open-loop or ad-hoc method shown in FIG. 10 relies on continuous tracking to determine the external magnetic field vector $B_{ext}(t)$ based on subtraction of the known bias control magnetic field $B_{bias}(t)$ from the total estimated incident field $\hat{B}_t(t)$. The determination of the external magnetic field vector $B_{ext}(t)$, however, may be affected due to sensitivity to external in-band and corrupting disturbance fields or related Hamiltonian effects (e.g., temperature, strain). Moreover, the above open loop method requires constant re-calibration and compensation during measurement.

Figure 11:
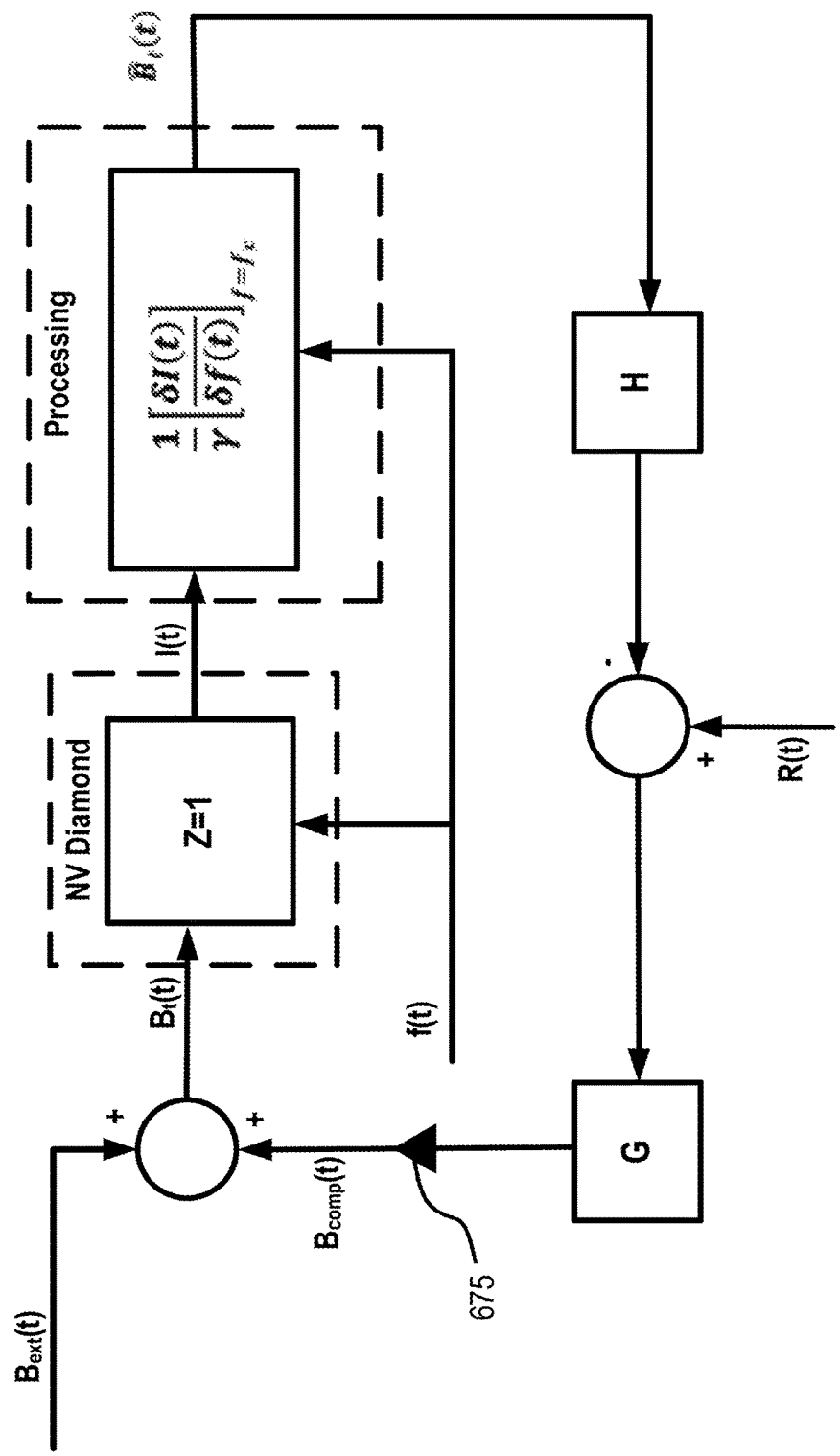
FIG. 11 is a signal flow block diagram of a closed loop processing of the total incident magnetic field on the NV center magnetic sensor system.
Figure 12:
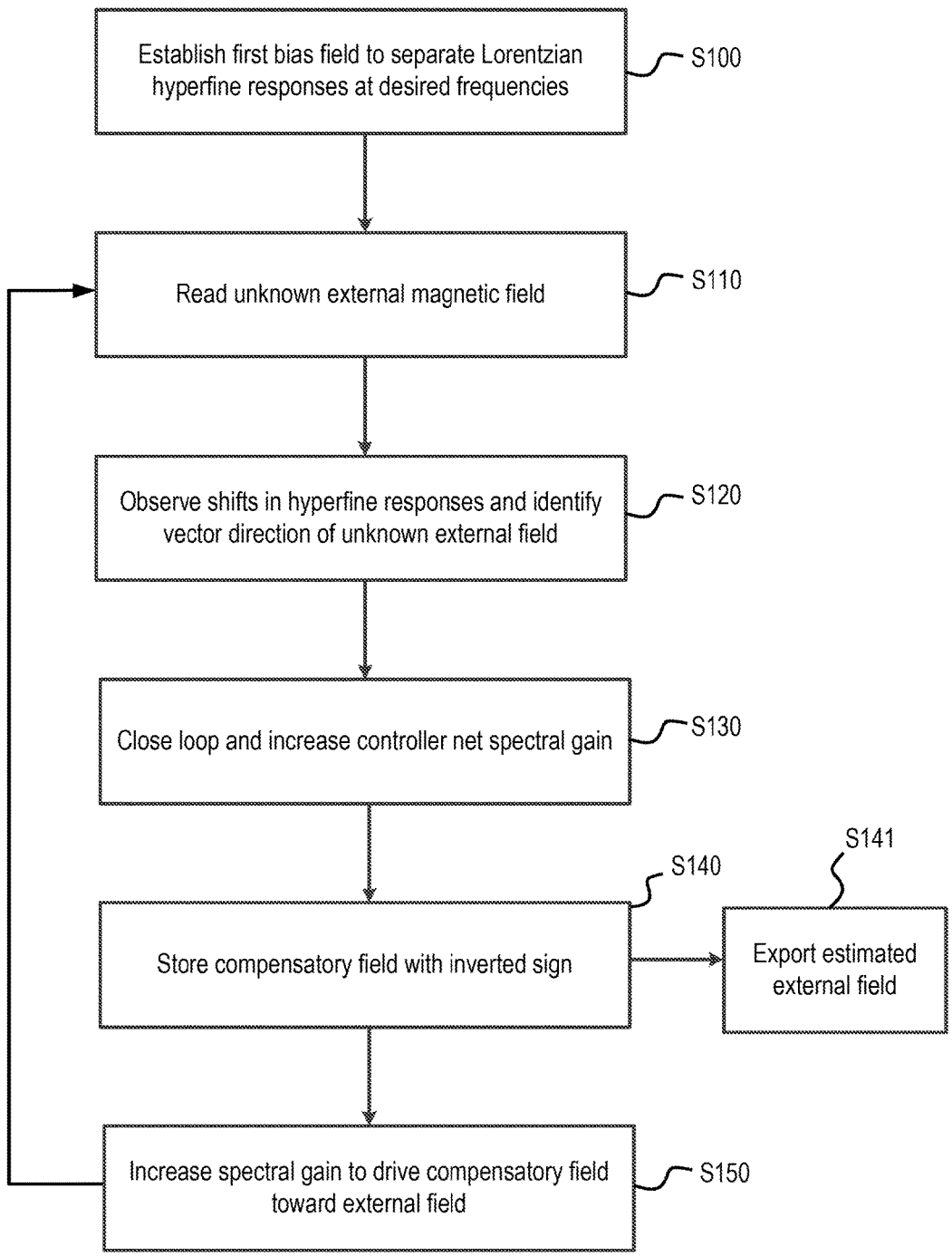
FIG. 12 is a flowchart showing a method of the closed loop processing of FIG. 11.

FIGS. 11 and 12 show a closed loop processing performed by the controller 680 according to an exemplary embodiment of the present invention. The closed loop processing described herein allows the estimated total incident magnetic field $\hat{B}_t(t)$ to be computed in real-time and actuated through the second magnetic field generator 675 to create a compensatory field $B_{comp}(t)$. This compensatory field may then be used to offset the shifts in RF response by the external magnetic field $B_{ext}(t)$ to produce a fluorescence response that remains constant and fixed, thus reducing the need for constant tracking of the response shifts. As a result, the compensatory field, which is the external magnetic field $B_{ext}(t)$ with an inverted sign, allows for the measurement and computation of the external magnetic field $B_{ext}(t)$ in real-time. FIG. 11 is a schematic diagram showing the closed loop processing using the compensatory field, while FIG. 12 is a flowchart depicting a method in performing the closed loop processing shown in FIG. 11.

As shown in FIG. 12, in a step S100, a bias field $B_{bias}(t)$ is applied to separate out the Lorentzian responses at desired frequencies (e.g., equally-spaced frequencies). As discussed above, the bias field may be applied using the first magnetic field generator 670 (e.g., a permanent magnet), which is known and constant. However, the bias field may alternatively be applied by the second magnetic field generator 675. In this case, an initial calibration offset R (shown in FIG. 11), in the form of a constant, is added to the driver G, which drives the second magnetic field generator 675 to generate the bias field necessary to separate the Lorentzian hyperfine responses. Once this is set, the closed loop processing may proceed to a step S110, where the unknown external magnetic field $B_{ext}(t)$ is read. As shown in FIG. 11, this step may be performed in a similar manner as the processing described with regard to FIG. 10, where an estimated total incident magnetic field $\hat{B}_t(t)$ is computed by evaluating the gradient of the intensity response I(t) as a function of applied frequency f(t) at the critical frequency.

In a step S120, shifts in the hyperfine responses are observed. Largest changes per a predetermined sampling period may be identified in order to identify the vector direction of the unknown magnetic field. The observed shifts may then be used to close the loop processing as shown in FIG. 11. Specifically, the closed loop processing includes a feedback controller block H along with an input of an arbitrary calibration reference R(t), which is set to 0 under normal operation but may be adjusted to collocate the Lorentzian responses (e.g., hyperfine responses) with as many vector components of the unknown external field as possible, and a driver block G. The feedback H and driver G serve as transfer functions to output a signal to the second magnetic field generator 675 to generate the compensatory field $B_{comp}(t)$ that represents the magnetic field needed to ensure that the largest gradient of the response remains fixed in terms of intensity response, thereby offsetting any shifts due to the external magnetic field $B_{ext}(t)$. Thus, as shown in FIG. 12, in a step S130, the loop is closed by increasing the controller net spectral gain. Loop closure may be achieved with the feedback H and driver G set as either constant gains (e.g., a Luenberger Observer) or state and measurement noise covariance driven variable gains (e.g., a Kalman filter) or a non-linear gain scheduled observer or the like, where each control system embodiment may be tailored to the specific application. In a step S140, a compensatory field $B_{comp}(t)$ is stored with an inverted sign to the shift observed in step S120. Because this compensatory field $B_{comp}(t)$ represents an equal, but opposite, magnetic field as the unknown external field $B_{ext}(t)$, the inverse of the compensatory field $B_{comp}(t)$ may be subsequently exported in a step S141 and stored in the controller 680 as the external field $B_{ext}(t)$ impinging on the system 600. In a step S150, the controller net spectral gain is further increased to drive the compensatory field $B_{comp}(t)$ to lock to the external field $B_{ext}(t)$ such that the observed intensity response remains fixed. The process then repeats by continuing to step S110. Such a processing allows for the compensatory field $B_{comp}(t)$ stored by the controller 680 to offset any shifts in the intensity response caused by the external field $B_{ext}(t)$, resulting in real-time computation of the external field by virtue of this processing.

The loop algebra for the closed loop processing may be represented as follows. As stated above, the total incident magnetic field is represented by the sum total of the unknown external field and the sum of the bias field and the compensatory field that is applied when the loop is closed. Because the bias field is constant over time, for the purposes of evaluating the required compensatory field needed for the closed loop processing, the bias field will be excluded in the loop algebra below. Thus, the total incident field may be represented by:

$$B_t(t) = B_{ext}(t) + B_{comp}(t) \quad (4)$$

Because of the linear relationship between the intensity response I(t) and the total incident magnetic field $B_t(t)$ acting on the NV diamond material 620 due to the Zeeman effect, equation (3) may be expressed as:

$$\hat{B}_t(t) = \frac{1}{\gamma}\left[\frac{\delta I(t)}{\delta f(t)}\right]_{f=f_c} B_t(t) \quad (5)$$

Loop closure based on the estimated total magnetic field $\hat{B}_t(t)$ in order to produce the compensatory field $B_{comp}(t)$ using the feedback and driver gains and the calibration reference may be expressed as follows:

$$B_{comp}(t) = G(R - H\hat{B}_t(t)) \quad (6)$$

Combining equations (4) to (6) results in:

$$B_{comp}(t) = G\left(R - H\frac{1}{\gamma}\left[\frac{\partial I(t)}{\partial f(t)}\right]_{f=f_c}(B_{ext}(t) + B_{comp}(t))\right) \quad (7)$$

During normal operation of the closed loop processing, the calibration reference R will not vary over time and will be 0. Thus, equation (7) may be reduced as follows:

$$B_{comp}(t)\left(1 + GH\frac{1}{\gamma}\left[\frac{\partial I(t)}{\partial f(t)}\right]_{f=f_c}\right) = -GH\frac{1}{\gamma}\left[\frac{\partial I(t)}{\partial f(t)}\right]_{f=f_c} B_{ext}(t) \quad (8)$$

$$B_{comp}(t) = \frac{-GH\frac{1}{\gamma}\left[\frac{\partial I(t)}{\partial f(t)}\right]_{f=f_c} B_{ext}(t)}{\left(1 + GH\frac{1}{\gamma}\left[\frac{\partial I(t)}{\partial f(t)}\right]_{f=f_c}\right)} \quad (9)$$

$$\frac{B_{comp}(t)}{B_{ext}(t)} = \frac{-1}{1 + \frac{1}{GH\frac{1}{\gamma}\left[\frac{\partial I(t)}{\partial f(t)}\right]_{f=f_c}}} \quad (10)$$

As can be seen from equation (10), as the gradient of the intensity response I(t) becomes larger at the critical frequency, the relationship between the compensatory field $B_{comp}(t)$ and the unknown external field $B_{ext}(t)$ will approach 1, such that $B_{comp}(t) = -B_{ext}(t)$. Thus, by use of the hyperfine responses, which exhibit a largest slope that may be three orders of magnitude greater than the largest slope of the aggregate Lorentzian responses, such a relationship may be achieved with the closed loop processing. This, in turn, allows for an unknown external field $B_{ext}(t)$ to be measured and computed in real time by virtue of the loop gain equivalent actuation of the second magnetic field generator 675 by the controller 680 using the compensatory field $B_{comp}(t)$ with an inverted sign.

While the transfer functions G and H are shown as constant operators in equations (6) to (10) and FIG. 11, the transfer functions can both be realized by analog circuitry as continuous, time invariant system functions in the frequency domain such as, for example, G (s): s=a+bi, where s is the Laplace operator. Alternatively, the control system may implemented in a digital computer that executes sampling and computation at regular time intervals of T seconds, where the transfer function G (z) may be defined with z=exp(sT) being the $z_{domain}$ discrete sampled data frequency domain operator.

As described above, the control loop processing of the system 600 provides a means to fix the hyperfine responses despite changes in the external magnetic field. By dynamically fixing the responses, a smaller bias magnetic field may be utilized, while still retaining a robust means to detect and calculate changes due to the external magnetic field. The application of a smaller bias magnetic field, in turn, reduces the frequency range needed for the RF excitation sweep and measurement circuits of the intensity response, which provides a system that is more responsive and efficient in determining the external magnetic field acting on the system. In addition, the range of signal amplitudes to which the system can detect and respond to quickly and accurately may be significantly improved, which can be especially important for large amplitude magnetic field applications.

The embodiments of the inventive concepts disclosed herein have been described in detail with particular reference to preferred embodiments thereof, but it will be understood by those skilled in the art that variations and modifications can be effected within the spirit and scope of the inventive concepts.

What is claimed is:

1. A system for magnetic detection, comprising:
 a nitrogen vacancy (NV) diamond material comprising a plurality of NV centers;
 a magnetic field generator configured to generate a magnetic field that is applied to the NV diamond material;
 a radio frequency (RF) excitation source configured to provide RF excitation to the NV diamond material;
 an optical excitation source configured to provide optical excitation to the NV diamond material;
 an optical detector configured to receive an optical signal emitted by the NV diamond material; and
 a controller configured to:
 compute a total incident magnetic field at the NV diamond material based on the optical signal emitted by the NV diamond material; and
 drive the magnetic field generator to generate a compensatory magnetic field, the generated compensatory magnetic field being set to offset a shift in the optical signal emitted by the NV diamond material caused by an external magnetic field.

2. The system for magnetic detection of claim 1, wherein the compensatory magnetic field is the inverse of the external magnetic field.

3. The system for magnetic detection of claim 1, wherein the magnetic field generator comprises a plurality of coils configured to generate a magnetic field having a plurality of predetermined directions.

4. The system for magnetic detection of claim 3, wherein the plurality of coils is configured to generate a magnetic field having three predetermined directions, wherein each of the predetermined directions are orthogonal to one another.

5. The system for magnetic detection of claim 1, wherein the optical signal is based on hyperfine states of the NV diamond material.

6. The system for magnetic detection of claim 5, wherein the controller is configured to detect a gradient of the optical signal based on the hyperfine states of the NV diamond material.

7. The system for magnetic detection of claim 6, wherein the controller is configured to detect a point of the largest gradient of the optical signal.

8. A system for magnetic detection, comprising:
 a magneto-optical defect center material comprising a plurality of magneto-optical defect centers;
 means for generating a compensatory magnetic field applied to the magneto-optical defect center material;
 means for providing radio frequency (RF) excitation to the magneto-optical defect center material;
 means for detecting an optical signal emitted by the magneto-optical defect center material;
 means for receiving the optical signal emitted by the magneto-optical defect center material; and
 means for computing a total incident magnetic field at the magneto-optical defect center material based on the optical signal emitted by the magneto-optical defect center material,
 wherein the compensatory magnetic field is generated to offset a shift in the optical signal emitted by the magneto-optical defect center material caused by an external magnetic field.

9. The system of claim 8, wherein the optical signal is based on hyperfine states of the magneto-optical defect center material.

10. The system of claim 9, further comprising means for detecting a point of the largest gradient of the optical signal based on the hyperfine states of the magneto-optical defect center material.

11. The system of claim 9, further comprising means for generating a bias magnetic field, and means for detecting a plurality of points of the largest gradients of the optical signal based on the hyperfine states of the magneto-optical defect center material for a plurality of magneto-optical defect center orientations.

12. A system for magnetic detection, comprising:
 a magneto-optical defect center material comprising a plurality of magneto-optical defect centers;
 a first magnetic field generator configured to generate a bias magnetic field that is applied to the magneto-optical defect center material;
 a second magnetic field generator configured to generate a compensatory magnetic field that is applied to the magneto-optical defect center material;
 a radio frequency (RF) excitation source configured to provide RF excitation to the magneto-optical defect center material;
 an optical excitation source configured to provide optical excitation to the magneto-optical defect center material;
 an optical detector configured to receive an optical signal emitted by the magneto-optical defect center material; and
 a controller configured to:
 compute a total incident magnetic field at the magneto-optical defect center material based on the optical signal emitted by the magneto-optical defect center material;
 detect a shift in the optical signal emitted by the magneto-optical defect center material due to an external magnetic field; and
 drive the second magnetic field generator to generate the compensatory magnetic field to offset the shift in the optical signal emitted by the magneto-optical defect center material caused by the external magnetic field.

13. The system for magnetic detection of claim 12, wherein the compensatory magnetic field is the inverse of the external magnetic field.

14. The system for magnetic detection of claim 12, wherein the second magnetic field generator comprises a plurality of coils configured to generate a magnetic field having a plurality of predetermined directions.

15. The system for magnetic detection of claim 14, wherein the plurality of coils is configured to generate a magnetic field having three predetermined directions, wherein each of the predetermined directions are orthogonal to one another.

16. The system for magnetic detection of claim 12, wherein the first magnetic field generator is a permanent magnet.

17. The system for magnetic detection of claim 12, wherein the optical signal is based on hyperfine states of the magneto-optical defect center material.

18. The system for magnetic detection of claim 17, wherein the controller is configured to detect a point of the largest gradient of the optical signal based on the hyperfine states of the magneto-optical defect center material.

19. A method for magnetic detection using a magneto-optical defect center material comprising a plurality of magneto-optical defect centers, comprising:
   providing radio frequency (RF) excitation to the magneto-optical defect center material;
   providing optical excitation to the magneto-optical defect center material;
   receiving an optical signal emitted by the magneto-optical defect center material;
   computing a total incident magnetic field at the magneto-optical defect center material based on the optical signal emitted by the magneto-optical defect center material;
   detecting a shift in the optical signal emitted by the magneto-optical defect center material due to an external magnetic field; and
   generating a compensatory magnetic field, the generated compensatory magnetic field being set to offset the shift in the optical signal emitted by the magneto-optical defect center material caused by the external magnetic field.

20. A system for magnetic detection, comprising:
   a magneto-optical defect center material comprising a plurality of magneto-optical defect centers;
   a magnetic field generator configured to generate a magnetic field;
   a radio frequency (RF) excitation source configured to provide RF excitation to the magneto-optical defect center material;
   an optical excitation source configured to provide optical excitation to the magneto-optical defect center material;
   an optical detector configured to receive an optical signal emitted by the magneto-optical defect center material, wherein the optical signal is based on hyperfine states of the magneto-optical defect center material; and
   a controller configured to:
     compute a total incident magnetic field at the magneto-optical defect center material based on a point of the largest gradient of the hyperfine states of the magneto-optical defect center material;
     detect a shift of the optical signal emitted by the magneto-optical defect center material due to an external magnetic field; and
     drive the magnetic field generator to generate a compensatory magnetic field, the generated compensatory magnetic field being set to offset the shift in the optical signal emitted by the magneto-optical defect center material caused by the external magnetic field.

21. The system for magnetic detection of claim 20, wherein the controller is further configured to drive the magnetic field generator to generate a bias magnetic field, the bias magnetic field being configured to separate the optical signal based on the hyperfine states of the magneto-optical defect center material for a plurality of magneto-optical defect center orientations.

22. A method for magnetic detection using magneto-optical defect center material comprising a plurality of magneto-optical defect centers, comprising:
   providing radio frequency (RF) excitation to the magneto-optical defect center material;
   providing optical excitation to the magneto-optical defect center material;
   receiving an optical signal emitted by the magneto-optical defect center material;
   computing a total incident magnetic field at the magneto-optical defect center material based on the optical signal emitted by the magneto-optical defect center material; and
   generating a compensatory magnetic field, the generated compensatory magnetic field being set to offset a shift in the optical signal emitted by the magneto-optical defect center material caused by an external magnetic field.

23. The method of claim 22, wherein the optical signal is based on hyperfine states of the magneto-optical defect center material and wherein the method further comprises detecting a gradient of the optical signal based on the hyperfine states of the magneto-optical defect center material.

24. The method of claim 22, wherein a point of the largest gradient of the optical signal is detected.

25. A system for magnetic detection, comprising:
   a magneto-optical defect center material comprising a plurality of magneto-optical defect centers;
   a radio frequency (RF) excitation source configured to provide RF excitation to the magneto-optical defect center material;
   an optical excitation source configured to provide optical excitation to the magneto-optical defect center material;
   an optical detector configured to receive an optical signal emitted by the magneto-optical defect center material, wherein the optical signal is based on hyperfine states of the magneto-optical defect center material;
   a first magnetic field generator configured to generate a bias magnetic field, the bias magnetic field being configured to separate the optical signal based on the hyperfine states of the magneto-optical defect center material for a plurality of magneto-optical defect center orientations;
   a second magnetic field generator configured to generate a compensatory magnetic field; and
   a controller configured to:
     compute a total incident magnetic field at the magneto-optical defect center material based on a point of the largest gradient of the optical signal based on the hyperfine states of the magneto-optical defect center material for the plurality of magneto-optical defect center orientations;

detect a shift of the optical signal emitted by the magneto-optical defect center material due to an external magnetic field; and drive the magnetic field generator to generate a compensatory magnetic field, the generated compensatory magnetic field being set to offset the shift in the optical signal emitted by the magneto-optical defect center material caused by the external magnetic field.

26. A system for magnetic detection, comprising:

a magneto-optical defect center material comprising a plurality of magneto-optical defect centers;

a magnetic field generator configured to generate a magnetic field that is applied to the magneto-optical defect center material;

a radio frequency (RF) excitation source configured to provide RF excitation to the magneto-optical defect center material;

an optical excitation source configured to provide optical excitation to the magneto-optical defect center material;

an optical detector configured to receive an optical signal emitted by the magneto-optical defect center material; and a controller configured to:

compute a total incident magnetic field at the magneto-optical defect center material based on the optical signal emitted by the magneto-optical defect center material; and drive the magnetic field generator to generate a compensatory magnetic field, the generated compensatory magnetic field being set to offset a shift in the optical signal emitted by the magneto-optical defect center material caused by an external magnetic field.

27. The system for magnetic detection of claim 26, wherein the compensatory magnetic field is the inverse of the external magnetic field.

28. The system for magnetic detection of claim 26, wherein the magnetic field generator comprises a plurality of coils configured to generate a magnetic field having a plurality of predetermined directions.

29. The system for magnetic detection of claim 28, wherein the plurality of coils is configured to generate a magnetic field having three predetermined directions, wherein each of the predetermined directions are orthogonal to one another.

30. The system for magnetic detection of claim 26, wherein the optical signal is based on hyperfine states of the magneto-optical defect center material.

31. The system for magnetic detection of claim 30, wherein the controller is configured to detect a gradient of the optical signal based on the hyperfine states of the magneto-optical defect center material.

32. The system for magnetic detection of claim 31, wherein the controller is configured to detect a point of the largest gradient of the optical signal.

33. The system for magnetic detection of claim 8, wherein the magneto-optical defect center material is a nitrogen vacancy diamond material.

34. The system for magnetic detection of claim 12, wherein the magneto-optical defect center material is a nitrogen vacancy diamond material.

35. The method for magnetic detection of claim 19, wherein the magneto-optical defect center material is a nitrogen vacancy diamond material.

36. The system for magnetic detection of claim 20, wherein the magneto-optical defect center material is a nitrogen vacancy diamond material.

37. The method for magnetic detection of claim 22, wherein the magneto-optical defect center material is a nitrogen vacancy diamond material.

38. The system for magnetic detection of claim 25, wherein the magneto-optical defect center material is a nitrogen vacancy diamond material.

* * * * *